(12) United States Patent
Kaushal et al.

(10) Patent No.: US 7,406,644 B2
(45) Date of Patent: Jul. 29, 2008

(54) MONITORING A THERMAL PROCESSING SYSTEM

(75) Inventors: Sanjeev Kaushal, San Jose, CA (US); Pradeep Pandey, San Jose, CA (US); Kenji Sugishima, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 384 days.

(21) Appl. No.: 11/278,012

(22) Filed: Mar. 30, 2006

(65) Prior Publication Data
US 2007/0255991 A1 Nov. 1, 2007

(51) Int. Cl.
*G01R 31/28* (2006.01)

(52) U.S. Cl. ........................... 714/733; 702/130

(58) Field of Classification Search .............. 374/126; 438/17; 702/183, 185, 182, 130; 714/733
See application file for complete search history.

(56) References Cited

U.S. PATENT DOCUMENTS

| 5,443,315 | A | * | 8/1995 | Lee et al. ............ 374/126 |
| 5,970,313 | A | * | 10/1999 | Rowland et al. ...... 438/17 |
| 6,195,621 | B1 | * | 2/2001 | Bottomfield ......... 702/183 |
| 6,351,723 | B1 | * | 2/2002 | Maekawa ........... 702/185 |
| 6,803,548 | B2 | | 10/2004 | Wang et al. |

* cited by examiner

*Primary Examiner*—David Ton
(74) *Attorney, Agent, or Firm*—Wood, Herron & Evans, LLP

(57) ABSTRACT

A method of monitoring a thermal processing system in real-time using a built-in self test (BIST) table to detect, diagnose and/or predict fault conditions and/or degraded performance. The method includes positioning a plurality of wafers in a processing chamber in the thermal processing system, performing a self test process, determining a real-time transient error from a measured transient response and a baseline transient response determined by a BIST rule stored in the BIST table, and comparing the transient error to operational limits and warning limits established by the BIST rule for the self test process.

25 Claims, 17 Drawing Sheets

MONITORING A THERMAL PROCESSING SYSTEM

FIELD OF THE INVENTION

This invention relates to methods for monitoring a Thermal Processing System (TPS) to detect, diagnose, and predict fault conditions in real-time.

BACKGROUND OF THE INVENTION

Several processes in semiconductor manufacturing involve processing wafers at high temperatures. In a typical such process, the process chamber is brought to an elevated temperature; subsequently certain process gases are introduced into the chamber to create desired process conditions.

Both equipment manufacturers and chip-makers are continuously striving to improve overall equipment effectiveness (OEE) and to reduce scrap, to increase equipment uptime, and to reduce the use of costly and time-consuming test wafers. The focus is now shifting to determining the "health" of the equipment on an on-going basis to detect "emerging" fault conditions as well.

The need to determine the health of a system can be extended to Thermal Processing Systems. In TPS equipment, there is a need to detect, diagnose, and predict error conditions.

SUMMARY OF THE INVENTION

The present invention is directed to a method for detecting, diagnosing, and/or predicting fault conditions in a thermal processing system (TPS), and for detecting, diagnosing, and/or predicting degraded performance to prevent fault conditions from occurring in the TPS. The invention provides a method of monitoring a thermal processing system using a Built-In Self Test (BIST) table. The method can include positioning a plurality of wafers in a thermal processing chamber, where the thermal processing chamber is divided into different zones and one or more of the wafers are positioned in each zone. Then, a first self test process can be performed using a first set of process parameters, and the first set of process parameters can be established by a first BIST rule created for the thermal processing system and stored in the BIST table. Next, a transient error can be determined in real-time using a difference between a measured transient response and a baseline transient response determined by the first BIST rule, and the transient error can be compared to an operational limit established by the first BIST rule. The first self test process can continue when the transient error is within the operational limit established by the first BIST rule created for the first self test process. Finally, the transient error can be compared to warning limits established for the first self test process when transient error is not within the operational limit established by the first BIST rule created for the first self test process, and either a warning message can be sent identifying a first transient error problem and the first self test process can be continued when the transient error is within the warning limits, or a fault message can be sent identifying a second transient error problem when the transient error is not within at least one warning limit established for the first self test process.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF EMBODIMENTS OF THE INVENTION

The invention relates to semiconductor manufacturing processes that involve thermal processing. TPS processing chambers are typically configured for multi-wafer, or batch operation. Such processing chambers can be used for processing various types of wafers, which can include Silicon (Si), Germanium (Ge), Gallium Arsenide (GaAs), or other semiconductor materials.

In accordance with the present invention, a thermal processing system can be monitored in real-time using a Built-In Self Test (BIST) table. In one embodiment, one or more process parameters are changed or maintained, responses thereto are predicted and measured, and a dynamic estimation error is calculated and compared to operational limits and/or warning limits established for BIST rules in the BIST table. The process can then be continued, paused or stopped depending on whether the dynamic estimation error is within the operational limits and/or within the warning limits in the BIST table.

In one embodiment of the present invention, a method is provided for the detection, diagnosis, and prediction of fault conditions to identify malfunction and error conditions in the thermal processing system as well as indicate drift and degradation that may lead to fault conditions.

In another or further embodiment, the present invention identifies malfunctions and/or error conditions in the thermal processing system as well as indicates drift and degradation that may be leading to an impending fault condition. Data to analyze the thermal processing system can be obtained either in a "Real-Time Mode", during a productive operation of the system, or in a "Maintenance Mode", where periodic self tests are conducted during idle time.

Figure 1:
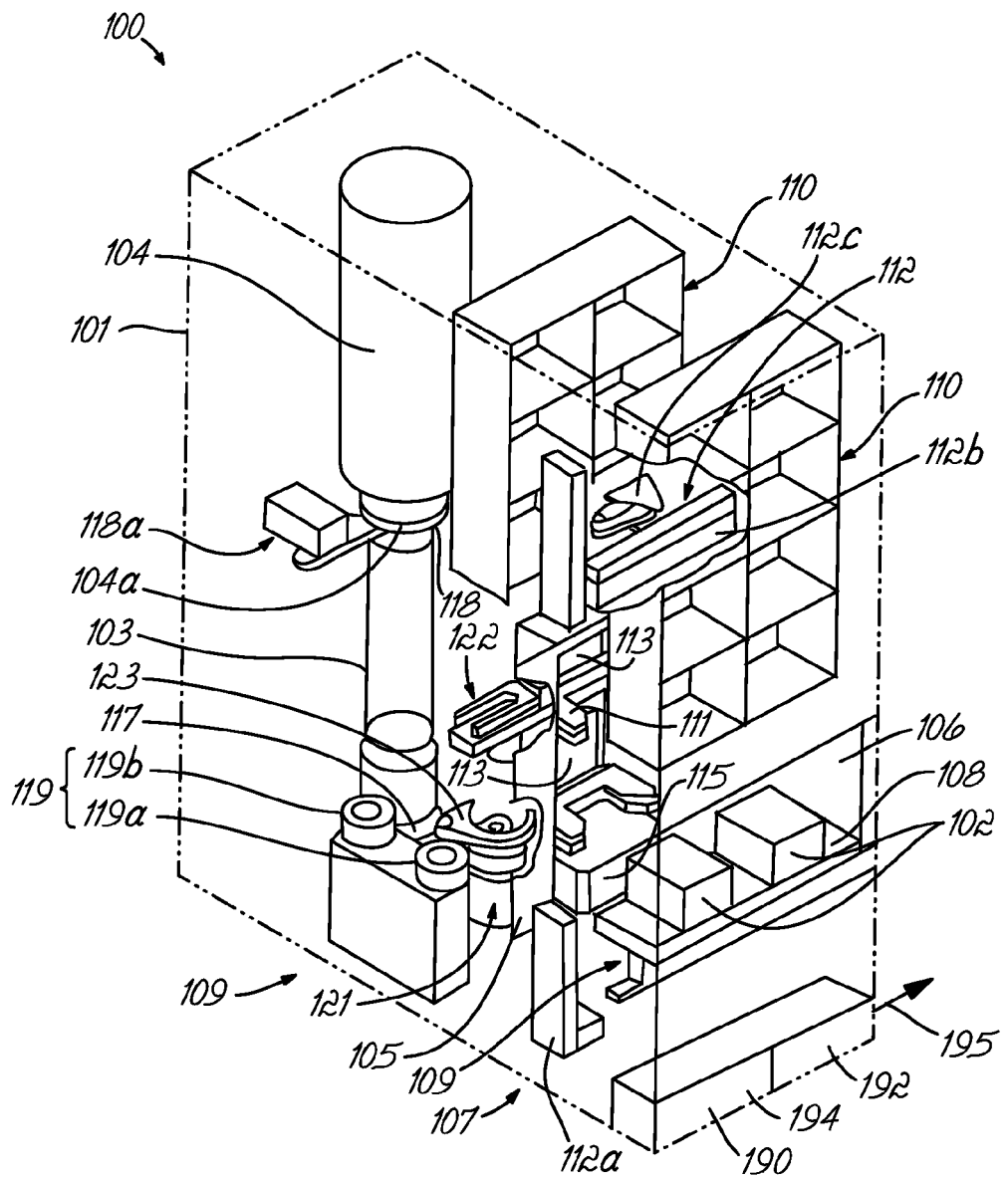
FIG. 1 is an isometric view of a thermal processing system in accordance with embodiments of the invention.

The invention will now be described with reference to the drawings. FIG. 1 is an isometric view of a thermal processing system in accordance with embodiments of the invention. The thermal processing system 100 can comprise a housing 101 that forms the outside walls of the thermal processing system when it is configured in a clean room. The interior of the housing 101 is divided by a partition (bulkhead) 105 into a carrier-transferring area 107 into and from which carriers 102 are conveyed and in which the carriers 102 are kept, and a loading area 109 where wafers to be processed (not shown), such as semiconductor wafers W, located in the carriers 102 are transferred to boats 103. The boats 103 are loaded into or unloaded from a vertical type thermal processing chamber 104.

As shown in FIG. 1, an entrance 106 is provided in the front of the housing 101 for introducing and discharging the carriers 102 by an operator or an automatic conveying robot (not shown). The entrance 106 is provided with a door (not shown) that can move vertically to open and close the entrance 106. A stage 108 is provided near the entrance 106 in the carrier-transferring area 107 for placing the carriers 102 thereon.

As shown in FIG. 1, a sensor mechanism 109 is provided at the rear portion of the stage 108 for opening a lid (not shown) of a carrier 102 and detecting positions of and the number of the semiconductor wafers W in the carrier 102. In addition, there may be shelf-like storing sections 110 above the stage 108 for storing a plurality of the carriers 102.

Two carrier-placing portions (transfer stages) 111 are provided in vertically spaced positions as tables for placing the carriers 102 thereon for transferring the semiconductor wafers W. Thus, the throughput of the processing system 100 can be improved as one carrier 102 can be exchanged at one carrier-placing portion 111 while the semiconductor wafers W are transferred to another carrier 102 at the other carrier-placing portion 111.

A carrier transference mechanism 112 is arranged in the carrier-transferring area 107 for transferring the carriers 102 to and from the stage 108, the storing sections 110, and the carrier placing portions 111. The carrier transference mechanism 112 comprises: an elevating arm 112$b$ which can be moved vertically by an elevating mechanism 112$a$ provided on a side of the carrier-transferring area 107, and a transferring arm 112$c$ mounted on the elevating arm 112$b$ for supporting the bottom of the carrier 102 to horizontally transfer the carrier 102.

For example, the carrier 102 can be a closed type, which can house 13 or 25 wafers and which can be hermetically closed by a lid (not shown). The carrier 102 can comprise a portable plastic container for housing and holding wafers W in multiple levels in horizontal attitude and in vertically spaced relation by a prescribed pitch. In one embodiment, the diameter of the wafer W can be 300 mm. Alternately, other wafer sizes may be used. The lid (not shown) is removably attached at the wafer-entrance formed in the front of the carrier 102 in such a manner that the lid can sealingly close the wafer-entrance.

Clean atmospheric air, which has passed through filters (not shown), can be provided into the carrier-transferring area 107, so that the carrier-transferring area 107 is filled with the clean atmospheric air. In addition, clean atmospheric air can also be provided into the loading area 109, so that the loading area 109 is filled with the clean atmospheric air. Alternately, an inert gas, such as nitrogen ($N_2$), is supplied into the loading area 109, so that the loading area is filled with the inert gas.

As shown in FIG. 1, the partition 105 has two openings 113, upper and lower, for transferring a carrier 102. The openings 113 can be aligned with the carrier-placing portions 111. Each opening 113 is provided with a lid (not shown) for opening and closing the opening 113. The opening 113 is formed in such a manner that the size of the opening 113 is substantially the same as that of the wafer-entrance of the carrier 102, so that semiconductor wafers W can be transferred into and from the carrier 102 through the opening 113 and the wafer-entrance.

In addition, a notch aligning mechanism 115 is arranged below the carrier-placing portions 111 and along a vertical central line of the carrier-placing portion 111 for aligning notches (cut portions) provided at peripheries of the semiconductor wafers W i.e. for aligning the crystalline directions of the semiconductor wafers W. The notch aligning mechanism 115 has an opening on the side of the loading area 107. The notch aligning mechanism 115 is adapted to align the notches of the semiconductor wafers W transferred from the carrier 102 on the carrier-placing portion 111 by a transferring mechanism 122.

The notch aligning mechanism 115 has two apparatus in vertically spaced positions, and each apparatus can align the notches of the wafers W. Thus, the throughput of the thermal processing system 100 can be improved because one apparatus can transfer back the aligned wafers W to the boat 103 while the other apparatus aligns other wafers W. Each apparatus may be adapted to align plural, for example three or five wafers at a time, such that the time for transferring the wafers W can be substantially reduced.

The thermal processing chamber 104 is disposed in a rear and upper portion in the loading area 109. The thermal processing chamber 104 has a chamber opening 104a in the bottom thereof. A lid 117 is provided below the chamber 104. The lid 117 is adapted to be vertically moved by an elevating mechanism (not shown) for loading a boat 103 into and unloading it from the chamber 104 and for opening and closing the chamber opening 104a. The boat 103, which can hold a large number of, for example 100 or 150 semiconductor wafers W in vertical equally spaced holding stages, is adapted to be placed on the lid 117. The boat 103 is made of crystal or the like. The thermal processing chamber 104 is provided with a shutter 118 at the chamber opening 104a for closing the chamber opening 104a while the lid 117 is taken off and the boat 103 is unloaded after the thermal processing. The shutter 118 is adapted to horizontally pivot to open and close the chamber opening 104a. A shutter driving mechanism 118a is provided to make the shutter 118 pivot.

Still referring to FIG. 1, a boat-placing portion (boat stage) 119 is disposed in a side region of the loading area 109 for placing the boat 103 thereon when transferring semiconductor wafers W into and from the boat 103. The boat-placing portion 119 has a first placing portion 119a and a second placing portion 119b arranged between the first placing portion 119a and the lid 117. A ventilating unit (not shown) is disposed adjacent the boat-placing portion 119 for cleaning the circulation gas (the clean atmospheric air or the inert gas) in the loading area 109 using filters.

A boat-conveying mechanism 121 is arranged between the carrier-placing portion 111 and the thermal processing chamber 104 in the lower portion in the loading area 109 for conveying the boat 103 between the boat-placing portion 119 and the lid 117. Specifically, the boat-conveying mechanism 121 is arranged for conveying the boat 103 between the first placing portion 119a or the second placing portion 119b and the lowered lid 117, and between the first placing portion 119a and the second placing portion 119b.

A transferring mechanism 122 is arranged above the boat-conveying mechanism 121 for transferring semiconductor wafers W between the carrier 102 on the carrier-placing portion 111 and the boat 103 on the boat-placing portion 119, and more specifically, between the carrier 102 on the carrier-placing portion 111 and the notch aligning mechanism 115, between the notch aligning mechanism 115 and the boat 103 on the first placing portion 119a of the boat-placing portion 119, and between the boat 103 after the thermal processing on the first placing portion 119a and a vacant carrier 102 on the carrier-placing portion 111.

As shown in FIG. 1, the boat-conveying mechanism 121 has an arm 123 which can support one boat 103 vertically and move (expand and contract) horizontally. For example, the boat 103 can be conveyed in a radial direction (a horizontal linear direction) with respect to the rotational axis of the arm 123 by synchronously rotating the arm 123 and a support arm (not shown). Therefore, the area for conveying the boat 103 can be minimized, and the width and the depth of the thermal processing system 100 can be reduced.

The boat-conveying mechanism 121 conveys a boat 103 of unprocessed wafers W from the first placing portion 119a to the second placing portion 119b. Then, the boat-conveying mechanism 121 conveys a boat 103 of processed wafers W from the lid 117 to the first placing portion 119a. Then, the boat-conveying mechanism 121 conveys the boat 103 of unprocessed wafers W onto the lid 117. In this manner, the unprocessed wafers W are prevented from being contaminated by particles or gases coming from the boat 103 of processed wafers W.

When a carrier 102 is placed on the stage 108 through the entrance 106, the sensor mechanism 109 detects the placing state of the carrier 102. Then, the lid of the carrier 102 is opened, and the sensor mechanism 109 detects positions of and the number of the semiconductor wafers W in the carrier 102. Then, the lid of the carrier 102 is closed again, and the carrier 102 is conveyed into a storing section 110 by means of the carrier transference mechanism 112.

A carrier 102 stored in the storing section 110 is conveyed onto the carrier-placing portion 111 at a suitable time by means of the carrier transference mechanism 112. After the lid of the carrier 102 on the carrier-placing portion 111 and the door of the opening 113 of the partition 105 are opened, the transferring mechanism 122 takes out semiconductor wafers W from the carrier 102. Then, the transferring mechanism 122 transfers them successively into a vacant boat 103 placed on the first placing portion 119a of the boat-placing portion 119 via the notch aligning mechanism 115. While the wafers W are transferred, the boat-conveying mechanism 121 is lowered to evacuate from the transferring mechanism 122, so that the interference of the boat-conveying mechanism 121 and the transferring mechanism 122 is prevented. In this manner, the time for transferring the semiconductor wafers W can be reduced, so that the throughput of the thermal processing system 100 can be substantially improved.

After the transference of the wafers W is completed, the transferring mechanism 122 can move laterally from an operating position to a holding position in the other side region of the housing 101.

After the thermal processing is completed, the lid 117 is lowered, and the boat 103 and the thermally processed wafers are moved out of the thermal processing chamber 104 into the loading area 109. The shutter 118 hermetically closes the opening 104a of the chamber immediately after the lid 117 has removed the boat 103. This minimizes the heat transfer out of the thermal processing chamber 104 into the loading area 109, and minimizes the heat transferred to the instruments in the loading area 109.

After the boat 103 containing the processed wafers W is conveyed out from the thermal processing chamber 104, the boat-conveying mechanism 121 conveys another boat 103 of unprocessed wafers W from the first placing portion 119a to the second placing portion 119b. Then, the boat-conveying mechanism 121 conveys the boat 103 containing the processed wafers W from the lid 117 to the first placing portion 119a. Then, the boat-conveying mechanism 121 conveys the boat 103 of unprocessed wafers from the second placing portion 119b onto the lid 117. Therefore, the unprocessed semiconductor wafers W in the boat 103 are prevented from being contaminated by particles or gases coming from the boat 103 of processed wafers W when the boats 103 are moved.

After the boat 103 of unprocessed wafers W is conveyed onto the lid 117, the boat 103 and the lid 117 are introduced into the thermal processing chamber 104 through the opening 104a after the shutter 118 is opened. The boat 103 of unprocessed wafers W can then be thermally processed. In addition, after the boat 103 of processed wafers W is conveyed onto the first placing portion 119a, the processed semiconductor wafers W in the boat 103 are transferred back from the boat 103 into the vacant carrier 102 on the carrier-placing portion 111 by means of the transferring mechanism 122. Then, the above cycle is repeated.

Setup, configuration, and/or operational information can be stored by the processing system 100, or obtained from an operator or another system, such as a factory system. BIST tables can be rule-based and can be used to specify the action taken for normal processing and the actions taken on exceptional conditions. Configuration screens can be used for defining and maintaining BIST tables. The operational limits, operational conditions, the BIST rules associated with them can be stored and updated as required. Documentation and help screens can be provided on how to create, define, assign, and maintain the BIST tables.

BIST tables can be used to determine when a process is paused and/or stopped, and what is done when a process is paused and/or stopped. In addition, BIST tables can be used to determine when to change a process and how to change the process. Furthermore, the BIST tables can be used to determine when to select a different dynamic/static model and how to create a new operational limit, and/or a new BIST rule in the process. In general, BIST tables allow system operation to change based on the dynamic state of the system.

In one embodiment, thermal processing system 100 can comprise a system controller 190 that can include a processor 192 and a memory 194. Memory 194 can be coupled to processor 192, and can be used for storing information and instructions to be executed by processor 192. Alternately, different controller configurations can be used. In addition, system controller 190 can comprise a port 195 that can be used to couple thermal processing system 100 to another system (not shown) via a network connection. Furthermore, controller 190 can comprise input and/or output devices (not shown) for coupling the controller 190 to other elements of the system.

In addition, the other elements of the system can comprise processors and/or memory (not shown) for executing and/or storing information and instructions to be executed during processing. For example, the memory may be used for storing temporary variables or other intermediate information during the execution of instructions by the various processors in the system. One or more of the system elements can comprise means for reading data and/or instructions from a computer readable medium. In addition, one or more of the system elements can comprise means for writing data and/or instructions to a computer readable medium.

Memory devices can include at least one computer readable medium or memory for holding computer-executable instructions programmed according to the teachings of the invention and for containing data structures, tables, records, rules, or other data described herein. System controller 190 can use data from computer readable medium memory to generate and/or execute computer executable instructions. The thermal processing system 100 can perform a portion or all of the methods of the invention in response to the system controller 190 executing one or more sequences of one or more computer-executable instructions contained in a memory. Such instructions may be received by the controller from another computer, a computer readable medium, or a network connection.

Stored on any one or on a combination of computer readable media, the present invention includes software for controlling the thermal processing system 100, for driving a device or devices for implementing the invention, and for enabling the thermal processing system 100 to interact with a human user and/or another system, such as a factory system. Such software may include, but is not limited to, device drivers, operating systems, development tools, and applications software. Such computer readable media further includes the computer program product of the present invention for performing all or a portion (if processing is distributed) of the processing performed in implementing the invention.

In addition, at least one of the elements of the thermal processing system 100 can comprise a graphic user interface (GUI) component (not shown) and/or a database component (not shown). In alternate embodiments, the GUI component and/or the database component are not required. The user interfaces for the system can be web-enabled, and can provide system status and alarm status displays. For example, a GUI component (not shown) can provide easy-to-use interfaces that enable users to: view status; create and edit SPC charts; view alarm data; configure data collection applications; configure data analysis applications; examine historical data; review current data; generate e-mail warnings; run multivariate models; view diagnostics screens; and view/create/edit BIST tables in order to more efficiently troubleshoot, diagnose, and report problems with the thermal processing system 100.

Figure 2:
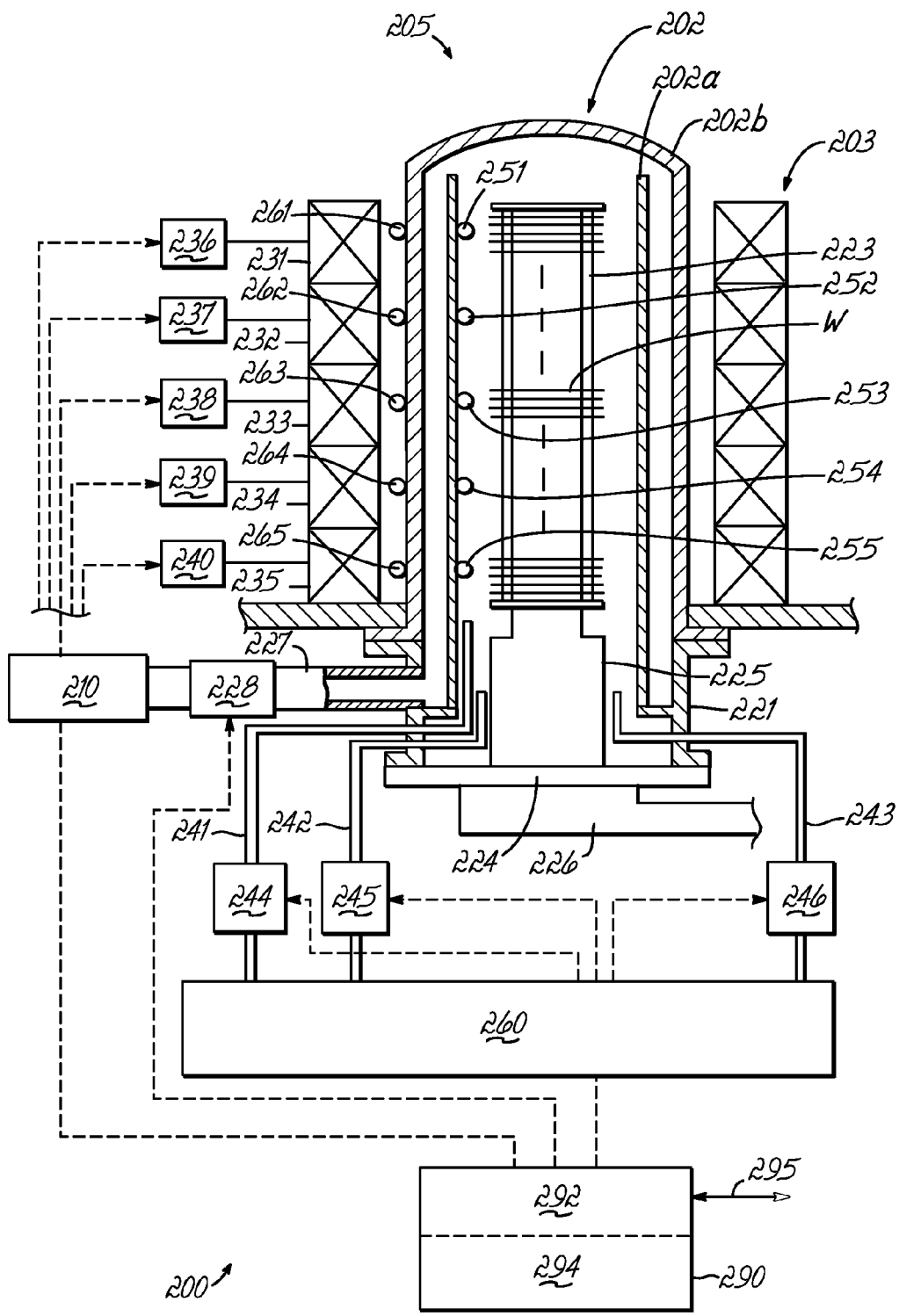
FIG. 2 is a partial cut-away schematic view of a portion of a thermal processing system in accordance with embodiments of the invention.

FIG. 2 is a partial cut-away schematic view of a portion of a semiconductor wafer processing system 200 in accordance with embodiments of the invention. In the illustrated embodiment, a thermal processing system 205, an exhaust system, 210, a gas supply system 260, and a controller 290 are shown.

The thermal processing system 205 can comprise a vertically oriented processing chamber (reaction tube) 202 having a double structure including an inner tube 202a and an outer tube 202b which are formed of, e.g., quartz, and a cylindrical manifold 221 of metal disposed on the bottom of processing chamber 202. The inner tube 202a is supported by the manifold 221 and has an open top. The outer tube 202b has its lower end sealed air-tight to the upper end of the manifold 221 and has a closed top.

In the processing chamber 202, a number of wafers W (e.g., 150) are mounted on a wafer boat 223 (wafer holder), horizontally one above another at a certain pitch in a shelves-like manner. The wafer boat 223 is held on a lid 224 through a heat insulation cylinder (heat insulator) 225, and the lid 224 is coupled to moving means 226.

The thermal processing system 205 can also comprise a heater 203 in the form of, e.g., a resistor disposed around the processing chamber 202. The heater 203 can comprise five stages of heaters 231-235. Alternately, a different heater configuration can be used. The respective heater stages 231-235 are supplied with electric power independently of one another from their associated electric power controllers 236-240. The heater stages 231-235 can be used to divide the interior of the processing chamber 202 into five zones.

A gas supply system 260 is shown coupled to the controller 290 and the thermal processing system 205. The manifold 221 has a plurality of gas feed pipes 241-243 for feeding gases into the inner tube 202a. Processing gasses can be fed to the respective gas feed pipes 241, 242, 243 through flow rate adjusters 244, 245, 246, such as mass flow controllers (MFCs). Alternatively, a multi-zone gas injection system can be used and/or other process gasses may be used.

An exhaust pipe 227 is connected to the manifold 221 for the exhaustion through the gap between the inner pipe 202a and the outer pipe 202b. The exhaust pipe 227 is connected to an exhaust system 210 that can include a vacuum pump (not shown). A pressure adjuster 228 including a combination valve, a butterfly valve, valve drivers, etc. can be inserted in the exhaust pipe 227 for adjusting a pressure in the processing chamber 202. Alternatively, a different configuration may be used for the exhaust system 210. The exhaust system 210 and/or the pressure adjuster 228 can include monitoring devices (not shown) that can exchange data with the controller 290.

The thermal processing system 205 can also comprise a number of sensors. In the illustrated embodiment, five inner temperature sensors (thermocouples) 251-255 are disposed on the inside of the inner tube 202a in vertical alignment with each other. The inner temperature sensors 251-255 are covered with, e.g., quartz pipes for the prevention of metal contamination of semiconductor wafers W. The inner temperature sensors 251-255 are arranged corresponding to the five zones. Alternately, a different number of zones may be used, a different number of inner temperature sensors may be used, and the inner sensors may be positioned differently. In other embodiments, other techniques may be used to measure temperature, and/or other types of sensors may be used to monitor the processing chamber.

A plurality of outer temperature sensors (thermocouples/temperature meters) 261-265 is disposed on the outside of the outer tube 202b in vertical alignment with each other. The outer temperature sensors 261-265 can also be arranged corresponding to the five zones. Alternately, a different number of zones may be used, a different number of outer temperature sensors may be used, and the outer sensors may be positioned differently.

The controller 290 can be used to control process parameters, such as a temperature of a wafer in the chamber, a temperature of the chamber, a process chemistry, a gas flow rate, and pressure in the processing chamber 202. The controller 290 receives output signals of the inner temperature sensors 251-255 and outer temperature sensors 261-265 to output control signals to the electric power controllers 236-240, the pressure adjuster 228 and the flow rate adjusters 244-246.

Setup, configuration, and/or operational information can be stored by the controller 290, or obtained from an operator or another controller, such as a controller 190 (FIG. 1). Controller 290 can also use BIST tables to determine the action taken for normal processing and the actions taken on exceptional conditions. Controller 290 can manage configuration screens that can be used for defining and maintaining BIST tables. Controller 290 can store and update the BIST tables as required. Controller 290 can manage documentation and help screens that can be used to create, define, assign, and maintain the BIST tables.

Controller 290 can use BIST tables in real time to determine when a process is paused and/or stopped, and what is done when a process is paused and/or stopped. In addition, BIST tables can be used to determine when to change a process and how to change the process.

In one embodiment, controller 290 can include a processor 292 and a memory 294. Memory 294 can be coupled to processor 292, and can be used for storing information and instructions to be executed by processor 292. Alternately, different controller configurations can be used. In addition, system controller 290 can comprise a port 295 that can be used to couple controller 290 to another computer and/or network (not shown). Furthermore, controller 290 can comprise input and/or output devices (not shown) for coupling the controller 290 to the thermal processing system 205, exhaust system, 210, and gas supply system 260.

Controller 290 can comprise means for reading data and/or instructions from a computer readable medium. In addition, controller 290 can comprise means for writing data and/or instructions to a computer readable medium.

Memory 294 can include at least one computer readable medium or memory for holding computer-executable instructions programmed according to the teachings of the invention and for containing data structures, tables, records, rules, or other data described herein. Controller 290 can use data from computer readable medium memory to generate and/or execute computer executable instructions. The thermal processing system 205, exhaust system, 210, a gas supply system 260, and a controller 290 can perform a portion or all of the methods of the invention in response the execution of one or more sequences of one or more computer-executable instructions contained in a memory. Such instructions may be received by the controller from another computer, a computer readable medium, or a network connection.

Stored on any one or on a combination of computer readable media, the present invention includes software for controlling the thermal processing system 205, exhaust system, 210, gas supply system 260, and a controller 290, for driving a device or devices for implementing the invention, and for enabling one or more of the system components to interact with a human user and/or another system. Such software may include, but is not limited to, device drivers, operating systems, development tools, and applications software. Such computer readable media further includes the computer program product of the present invention for performing all or a portion (if processing is distributed) of the processing performed in implementing the invention.

Controller 290 can comprise a GUI component (not shown) and/or a database component (not shown). In alternate embodiments, the GUI component and/or the database component are not required. The user interfaces for the system can be web-enabled, and can provide system status and alarm status displays. For example, a GUI component (not shown) can provide easy to use interfaces that enable users to: view status; create and edit charts; view alarm data; configure data collection applications; configure data analysis applications; examine historical data, and review current data; generate e-mail warnings; view/create/edit/execute dynamic and/or static models; view diagnostics screens; and view/create/edit BIST tables in order to more efficiently troubleshoot, diagnose, and report problems.

During a process, the controller 290 can cause one or more process parameters to change form one value to another value. A real-time dynamic model can be established for this particular system configuration based on the type of vertical wafer boat 223, the type, position, and quantity of wafers W, the type of thermal processing chamber 202, and the recipe to be performed.

The real-time dynamic pressure model can be executed to generate a predicted dynamic pressure response for the thermal processing chamber during the process. In addition, a measured dynamic pressure response can be created for the thermal processing chamber during the process, and a dynamic estimation error can be determined using a difference between the predicted dynamic response and the measured dynamic response. Furthermore, the dynamic estimation error can be compared to operational limits established for one or more BIST rules in a BIST table. The process can be stopped when the dynamic estimation error is not within operational limits established for at least one of the BIST rules in a BIST table, and the process can continue when the dynamic estimation error is within operational limits established for at least one of the BIST rules in a BIST table.

During operation, the temperatures of wafers W in the respective zones are estimated, and adaptive methods are used to control the heater stages 231-235 so that the corrected wafer temperatures can be equal to temperatures indicated by the recipe. When the temperature increase is completed, the adaptive control is used to retain the temperatures of the respective zones. Techniques for controlling a heating apparatus using models are disclosed in U.S. Pat. No. 6,803,548, entitled "Batch-type Heat Treatment Apparatus and Control Method for the Batch-type Heat Treatment Apparatus, which is incorporated by reference herein.

Controller 290 can also create a measured static and/or dynamic response using data from the inner temperature sensors 251-255, the outer temperature sensors 261-265, the electric power controllers 236-240, the pressure adjuster 228, or the flow rate adjusters 244-246, or a combination thereof.

Figure 3:
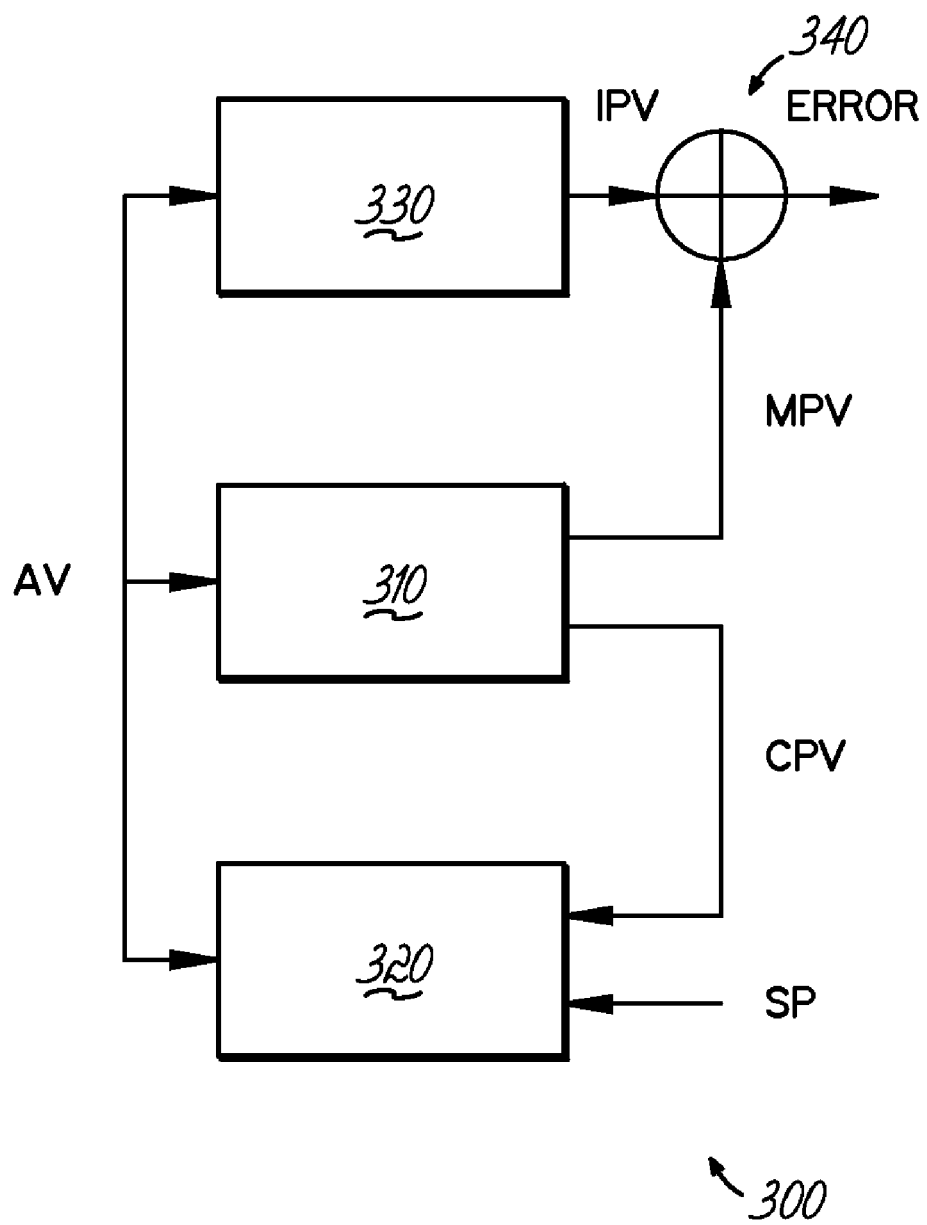
FIG. 3 illustrates a simplified block diagram of a thermal processing system in accordance with embodiments of the invention.

FIG. 3 illustrates a simplified block diagram of a processing system in accordance with embodiments of the invention. In the illustrated embodiment, a processing system 300 is shown that comprises a system 310, a controller 320, a dynamic model 330, and a comparator 340. In addition, actuation variables (AV) are shown, and these are the variables that have a fixed setpoint (SP) in the recipe or are generated in real-time by the controller 320 based on a setpoint in the recipe. For example, heater power, mass flow rate, and exhaust valve angle.

Two types of process variables (PV) are illustrated, and these are process conditions in the equipment as a result of the actuation variables (AV). Examples of process variables (PV) include chamber or wafer temperatures, chamber chemistry, reactant concentration at the wafers, and film thickness on the wafer. The process variables (PV) can be classified as measured process variables (MPV) that are measured using sensors and general process variables (GPV) that are not measured by sensors. Of the ones that are measured, some can be directly controlled via the controller 320—these are controlled process variables (CPV).

The AV, MPV, and SP are available in real-time. By definition, the GPV are not available (not measured); their effect may be deduced only by end-of-run measurements. For example, in a batch processing chamber, real-time data is available for chamber pressure, mass flow rates and their setpoints, valve angles, and chamber temperature for each zone.

The system dynamic performance is a composite picture of the system parameters that can be dependent on a number of variables. For example, system thermal response can be a function of an active, passive, or software component. Deviation in one or more of these components can lead to errors. For better detection and diagnosis, a "system level" approach can be used.

Recipes can be used in a system level, and a typical recipe provides the setpoints (SP) for the measured process variables (MPV), including the controlled process variables (CPV), and the system controller can control the actuation variables (AV) to reduce the error between the CPV and SP, where the Error=SP−CPV.

In one embodiment, BIST rules are used to determine if the system and/or the system components are behaving "as-designed" from the real-time data and dynamic models of the system components. Dynamic models provide the response of the system "as designed," and can be used for detecting error conditions. For example, an error can be computed using the difference between the modeled response (IPV) and the measured response as shown below:

Error=IPV−MPV

An alarm is created if this error is greater than pre-set operational thresholds. The operational thresholds can be part of a BIST table.

Figure 4:
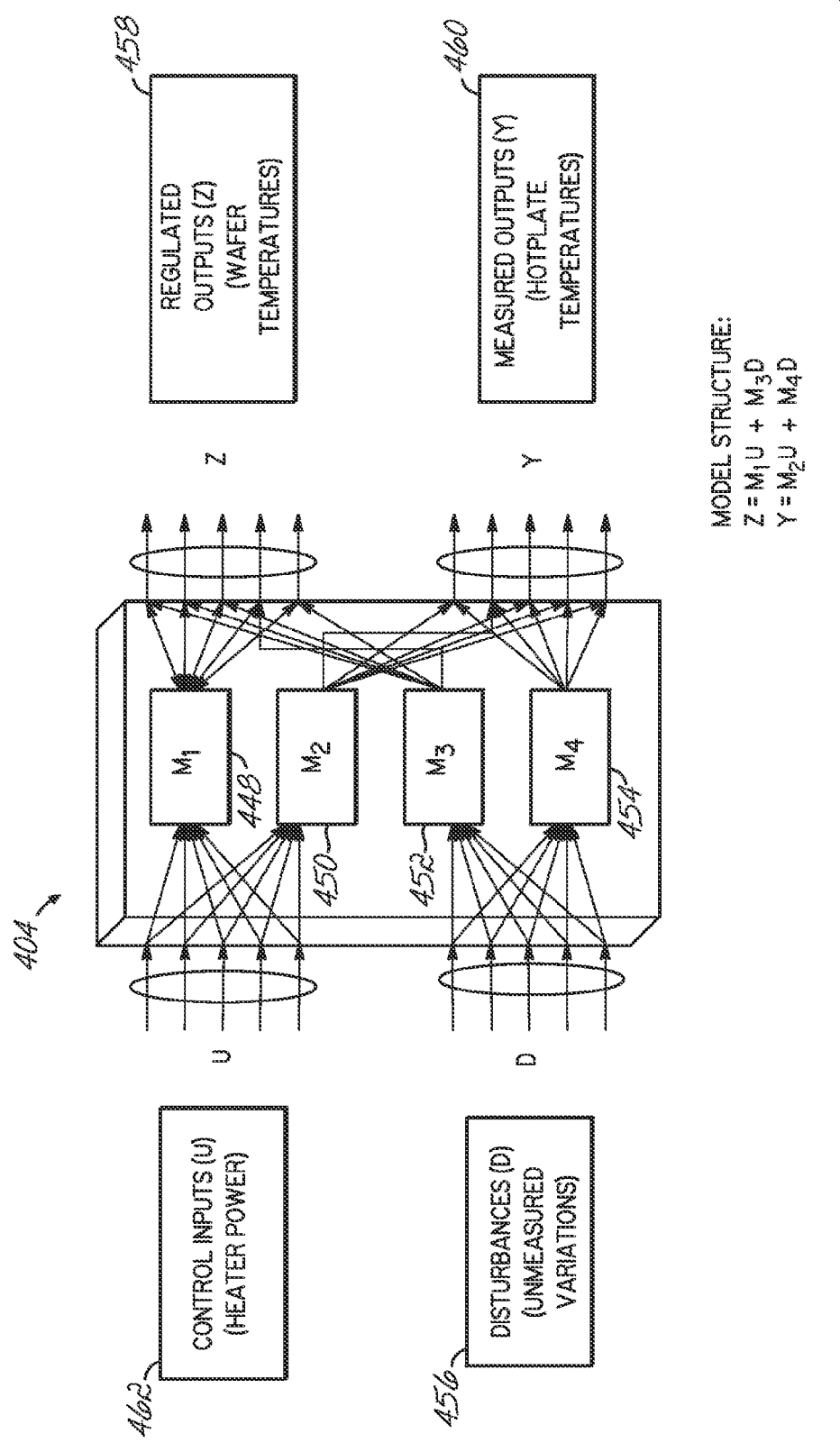
FIG. 4 illustrates a schematic representation of an embodiment of the dynamic model characterizing one or more of the responses of a thermal processing system in accordance with an embodiment of the invention.

FIG. 4 illustrates a schematic representation of an embodiment of a dynamic model 404 characterizing one or more of the responses of a thermal processing system in accordance with an embodiment of the invention. In the illustrated embodiment, four nodes or model components ($M_1$, $M_2$, $M_3$, and $M_4$) 448, 450, 452, 454 are shown. However, in alternative embodiments of the invention, a different number of model components may be used, and the model components may be arranged with a different architecture.

In addition, the dynamic model 404 receives control inputs (U) 462, such as heater power, chamber pressure, gas flow, and wafer information. The model also receives disturbance inputs (D) 456, such as unmeasured variations. The model determines regulated outputs (Z) 458, such as wafer temperatures, and measured outputs (Y) 460, such as chamber temperatures. The model structure may be expressed as $Z=M_1U+M_3D$ and $Y=M_2U+M_4D$. Alternately, a different expression for the model structure may be used.

The dynamic model 404 tracks the "state" of the system, and relates the inputs 462 to outputs 458, 460 in real-time. For example, U and Y may be measured, and by using the dynamic model 404, D may be estimated using $Y=M_2U+M_4D_{est}$ and Z may be estimated using $Z_{est}=M_1U+M_3D_{est}$.

When creating the dynamic model 404, wafer position, wafer curvature, and chamber effects may be incorporated into the model. For example, dynamic models 404 can be created using first principles models based on heat transfer, gas flow, and reaction kinetics, or on-line models created with real-time data collected from a processing system, such as a thermal processing system and/or MLD system.

During model development, a first principles model may be implemented numerically on a suitable microprocessor in a suitable software simulation application, such as Matlab. The software application resides on a suitable electronic computer or microprocessor, which is operated so as to perform the physical performance approximation. However, other numerical methods are contemplated by the present invention.

A model-based linear or nonlinear multivariable control approach may be used to model the thermal doses in which the controller comprises a mathematical model of the system to be controlled. The multivariable controller may be based on any of the modern control design methods such as linear-quadratic-gaussian (LQG) method, linear quadratic regulator (LQR) method, H-infinity (H-inf) method, etc. The thermal dose model may be either linear or nonlinear and either SISO or MIMO. The multivariable control approach (i.e., MIMO) considers all inputs and their effects on the outputs. Several other approaches for modeling the thermal doses are available, such as physical models, and data-driven models.

Figure 5:
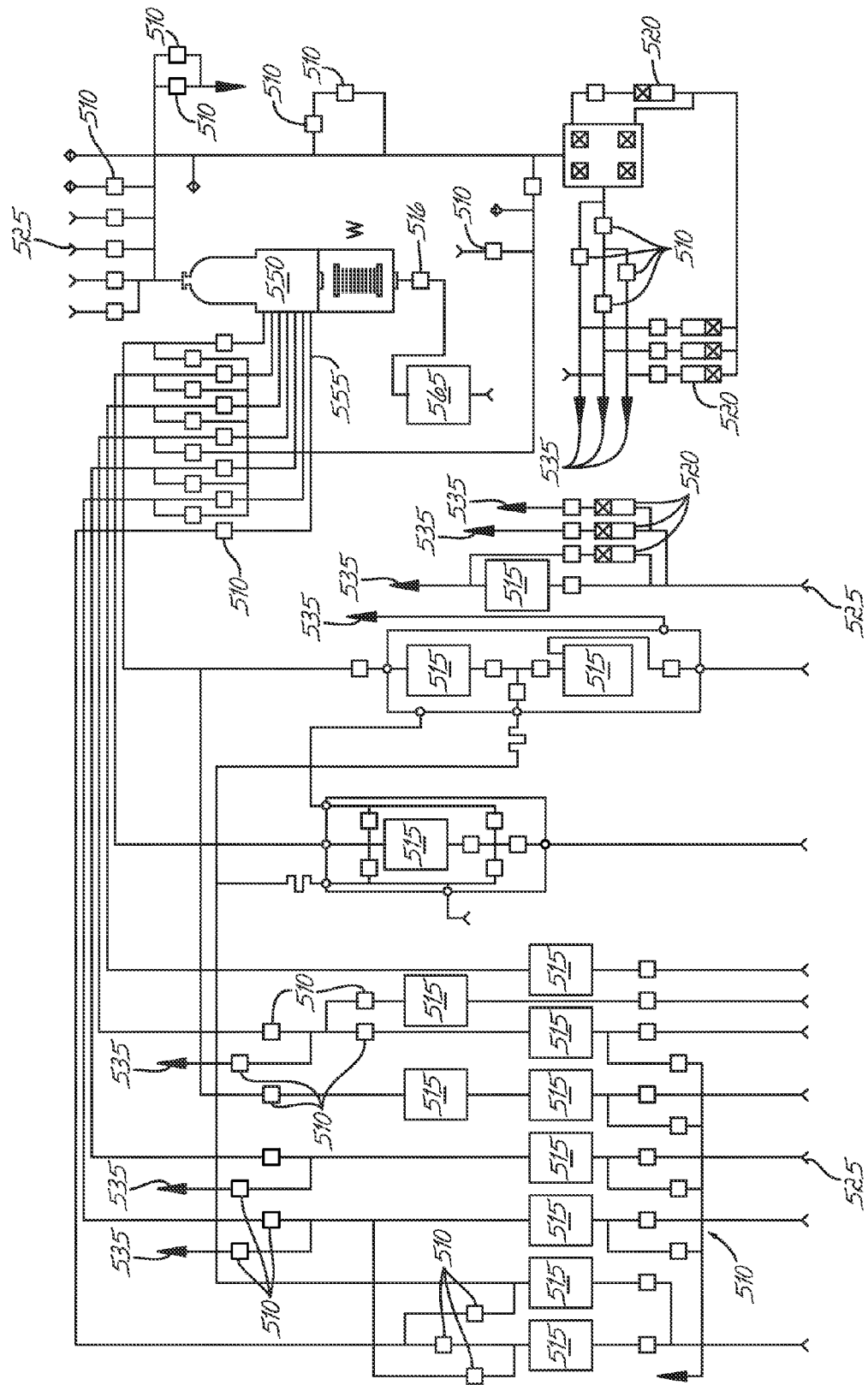
FIG. 5 illustrates a simplified schematic drawing for a thermal processing system in accordance with embodiments of the invention.

FIG. 5 illustrates a simplified schematic drawing for a semiconductor processing system in accordance with embodiments of the invention. In one embodiment, the processing equipment used in thermal processing can include a process chamber and gas flow system to create desired gas flow conditions in the process chamber. In the illustrated embodiment, a simplified schematic view of a TELFORMULA® System from Tokyo Electron Limited is shown that includes a number of components that enable both atmospheric and low-pressure operation, with a variety of gas species.

In the illustrated embodiment, a gas supply system is shown that includes mass flow controllers (MFC) 515, mass flow meters (MFM) 520, inputs 525, outputs 535, supply lines 555, and interlock valves 510. Alternatively, a different configuration may be used.

A process chamber 550 is shown that can process a number of wafers W. Alternatively, a different configuration may be used. In addition, an exhaust system 565 is shown that includes a pressure controller 516. Alternatively, a different configuration may be used.

For example, a semiconductor processing system may contain the following:

1) Gas supply system: This system can include one or more $N_2$ lines as well as the required process gas lines. For example, a gas line, such as a silane gas line, can contain the following:
   a) $SiH_4$ line with:
      i) Check valve: HV3
      ii) Pressure test point: PT3
   b) $N_2$ bypass line with:
      i) Check valve: HV2
      ii) Pressure test point: PT2
   c) Mass flow meter: MFM1
   d) Mass flow controller: MFC5
   e) Isolation valves: V8 and V9
   f) Chamber isolation valve: HV7

2) Pressure control system: The pressure control system can include one or more of the following:
   a) Main valve: MV, and slow valves: SV and SSV
   b) Automatic pressure controller: APC
   c) Vacuum gauge: VG5, ~100 Torr
   d) Vacuum gauge: VG2, ~1000 Torr 3) Process chamber: The process chamber can include one or more of the following:
   a) Vacuum gauge: VG1, 0~10 Torr
   b) Pirani gauge: VG3

4) Temperature control system: The temperature control system, from a self test and diagnostic point of view, can include the following components:
   a) Inner thermocouples (T/Cs)
   b) Outer thermocouples (T/Cs)
   c) Heater element
   d) Power sub-system
   e) Insulation 5) Controller: The controller, from a self test and diagnostic point of view, can include software, hardware, and/or firmware components.

In addition, the gas supply system, the pressure control system, the process chamber, and/or the temperature control system can include single and/or multiple zones.

In one embodiment, BIST rules can be created for gas supply system components, for exhaust system components, for chamber components, for temperature control components, for wafer transfer components, and/or other system components.

During system operation, error conditions can occur. For example, the types of error conditions can include a component failure, where an active, passive, or software component fails to perform a required task; a component degradation, where the performance of an active, passive, or software component is degraded, and a failure can occur in the near future if the degraded performance is not corrected; and a configurations error, where an active, passive, or software component is not configured properly.

A Built-In Self Test (BIST) system can be used with a Thermal Processing System (TPS) to detect, diagnose, and predict fault conditions when the TPS is employed in low-pressure semiconductor processing.

Over time, one or more of the parameters used to characterize a system component can drift and parameter drift may be manifested as offset (or bias) in readings, change in heater element resistance and power delivered, change in thermal insulation, etc. In addition, one or more of the parameters used to characterize a system component can degrade, and parameter degradation may be manifested as noise or dropouts in thermocouple reading; they usually indicate impending failure.

In various embodiments, the system and/or subsystem components can be examined to identify drift and/or degraded conditions. For example, the following drift or degraded conditions can be examined for the thermal processing subsystem components shown below:
   1) Inner thermocouples:
      a) Offset (i.e., an offset in the temperature reading)
      b) Noise
      c) Dropouts
   2) Outer thermocouples:
      a) Offset (i.e., an offset in the temperature reading)
      b) Noise
      c) Dropouts
   3) All thermocouples (i.e., if one or more of the thermocouples have a similar problem simultaneously, this can indicate problems with a hardware component, such as a T/C board).
   4) Heater zones (i.e., change in resistance and power delivered)
   5) Power subsystem (i.e., a degradation in the power control function)
   6) Insulation (i.e., a change in insulation properties).

In one embodiment, a BIST methodology can be based on the relation between the baseline performance of the thermal system and a measured performance that can be measured during the self tests performed in real-time on an on-going basis. For example, "baseline performance" can mean the performance when the system is known to be in good working condition.

The performance can be measured by examining data from the TPS—real-time measurements of the inner and outer T/C, temperature setpoints, heater powers, and other process parameters and/or stored measurements of the inner and outer T/C, temperature setpoints, heater powers, and other process parameters. When systems and/or subsystems have model-based controllers, "estimated" values for measured data can be obtained; these estimates can be calculated using dynamic models of the system; and the difference between "measured" and "estimated" parameters can be calculated, and the difference can be identified as an "estimation error". For example, some thermal processing systems from Tokyo Electron Limited can include a Model-Based Temperature Controller (MBTC) or ART™ control on the furnaces.

A first methodology can be used for thermal processing systems that do not have model-based controllers. This first methodology can be used by semiconductor manufacturers that have not installed thermal processing systems with model-based controllers. A second methodology can be used for thermal processing systems that do have model-based controllers. This second methodology can be used by semiconductor manufacturers that have installed thermal processing systems with model-based controllers. During both methodologies historical and/or real-time data can be used to monitor the thermal processing system.

The first exemplary methodology can be summarized as follows: when monitoring thermal processing systems without model-based controllers, the measured transient thermal response can be compared to one or more baseline transient thermal responses, and/or the measured steady-state thermal response can be compared to one or more baseline steady-state thermal responses.

The second exemplary methodology can be summarized as follows: when monitoring thermal processing systems with model-based controllers, the measured transient thermal response can be compared to one or more baseline transient thermal responses, and/or the measured steady-state thermal response can be compared to one or more baseline steady-state thermal responses. In addition, the measured transient estimation error can be compared to one or more baseline transient estimation errors during transient conditions and/or the measured steady state estimation errors can be compared to one or more baseline steady state estimation errors during steady-state conditions.

When comparing the baseline transient response to the measured transient response, one exemplary procedure can compare the ramp-up and ramp-down characteristics. These conditions are described as follows $$abs(TM(t1)-TB(t1))>\text{threshold}$$

$$abs(TM(t2)-TB(t2))>\text{threshold}$$

where TM and TB refer to the measured and baseline temperature values, respectively, at times t1, t2, etc.

When examining the steady-state response, one can assume that at the steady-state condition, there is a fixed relation between the heater powers applied and the outer and inner T/C values. Consider a first example when the inner thermocouples are at 700° C. Then, at steady-state, the outer thermocouples and the heater powers can be at their corresponding steady-state values. In some exemplary tests, the baseline values were compared to the measured values for the outer T/C and heater powers.

Figure 6:
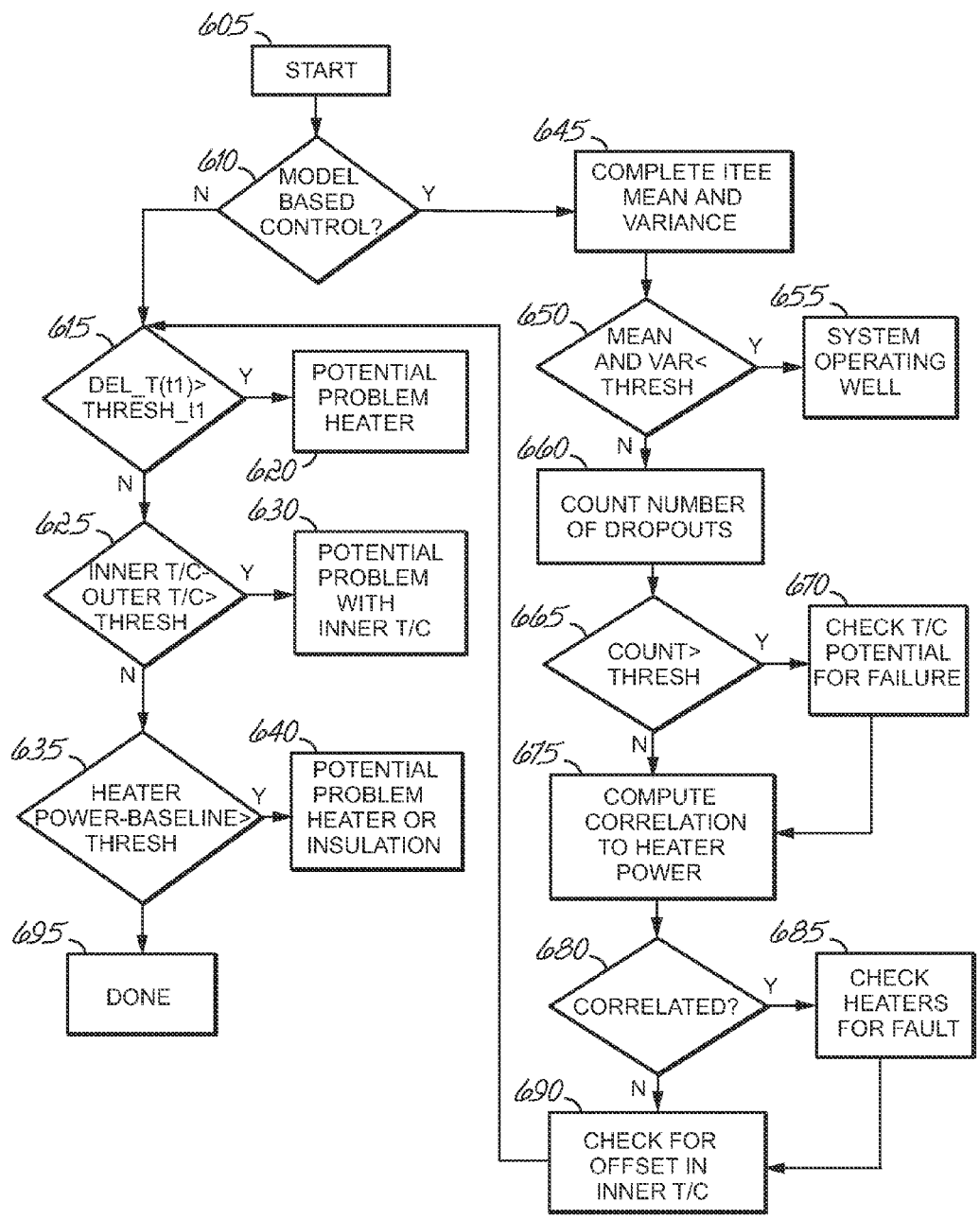
FIG. 6 illustrates a flow diagram of a method for monitoring a thermal processing system in accordance with embodiments of the invention.

FIG. 6 illustrates a flow diagram of a method for monitoring a thermal processing system in accordance with embodiments of the invention. During a monitoring procedure, one or more self test processes can be performed. In addition, the monitoring procedure can be performed during production and/or non-production processes. A number of process models can be created for a thermal processing system that can include temperature control components, pressure control components, gas supply components, measurement components that can include physical and/or virtual sensors, mechanical components, computing components, or software components, or combinations thereof. Procedure 600 can start in 605.

Models, BIST rules, process results data, and operational conditions data can be stored in the BIST table before, during, and/or after the process is performed.

In 610, a query can be performed to determine if the thermal processing system is operating with a model-based controller. Procedure 600 can branch to 645 and can continue as shown in FIG. 6 when the thermal processing system is operating using one or more model-based controllers. Procedure 600 can branch to 615 and can continue as shown in FIG. 6 when the thermal processing system is not using one or more model-based controllers.

First, taking the case of a thermal processing system that is not operating with a model-based controller, in 615, a query can be performed to determine if the temperature difference (DEL_T) is greater than a threshold (THRESH) established for the process and/or system. Thresholds can be established for different times (e.g., t1) during the monitoring procedure, and real-time queries can be performed during different times during the monitoring procedure. For example, thresholds can be established when a time-varied process result and/or parameter reaches 70%, 90%, and 99% of a final value. Alternatively, other percentages can be used. In addition, absolute values for the differences can be used in some cases. Alternatively, absolute values are not required for the differences. Procedure 600 can branch to 620 and can continue as shown in FIG. 6 when the temperature difference is greater than a threshold. Procedure 600 can branch to 625 and can continue as shown in FIG. 6 when the temperature difference is not greater than a threshold.

In 620, when the difference is greater than a threshold, a potential problem with the temperature control system can be identified. For example, a heater problem may be identified.

In 625, when the difference is not greater than a threshold, a query can be performed to determine if the difference between an inner temperature sensor measurement (inner T/C) and an outer temperature sensor measurement (outer T/C) is greater than a threshold established for the process and/or system. Thresholds can be established for different times (e.g., t1) during the monitoring procedure, and the query can be performed during different times during the monitoring procedure. For example, thresholds can be established when a time-varied process result and/or parameter reaches 70%, 90%, and 99% of a final value. Alternatively, other percentages can be used. In addition, absolute values for the differences can be used in some cases. Alternatively, absolute values are not required for the differences. Procedure 600 can branch to 630 and can continue as shown in FIG. 6 when the difference between an inner temperature sensor measurement and an outer temperature sensor measurement is greater than a threshold. Procedure 600 can branch to 625 and can continue as shown in FIG. 6 when the difference between an inner temperature sensor measurement and an outer temperature sensor measurement is not greater than a threshold. For example, the temperature sensor may be a thermocouple (T/C). Alternatively, other types of temperature sensors may be used.

In 630, when the difference is greater than a threshold, a potential problem with the temperature control system can be identified. For example, a temperature sensor problem may be identified.

In 635, when the difference is not greater than a threshold, a query can be performed to determine if a baseline measurement is greater than a threshold established for the process and/or system. For example, a baseline heater power can be used. Thresholds can be established for different times (e.g., t1) during the monitoring procedure, and the query can be performed during different times during the monitoring procedure. For example, thresholds can be established when a time-varied process result and/or parameter reaches 70%, 90%, and 99% of a final value. Alternatively, other percentages can be used. In addition, absolute values for the differences can be used in some cases. Alternatively, absolute values are not required for the differences. Procedure 600 can branch to 640 and can continue as shown in FIG. 6 when the baseline measurement is greater than a threshold. Procedure 600 can branch to 695 and can continue as shown in FIG. 6 when the baseline measurement is not greater than a threshold.

In 640, when the measurement is greater than a threshold, a potential problem with the temperature control system can be identified. For example, a heater and/or insulation problem may be identified.

In 695, when the measurement is not greater than a threshold, process 600 is done.

Second, taking the case of a thermal processing system that is operating with a model-based controller, in 645, an estimation error can be calculated. In one embodiment, an inner T/C estimation error (ITEE) can be used as a monitoring variable when a model-based controller is being used, and the ITEE mean and variance can be calculated. Alternatively, other parameters may be used as monitoring variables. For example, baseline values for ITEE for a given system can be used. As stated previously, the baseline condition applies to the measurements made when the system is known to be in good operating conditions. Then, using the results of a self test, parameters such as a Mean, Variance, and/or transient properties of the ITEE can be compared to threshold values to detect and diagnose problems with the system.

Table 1 illustrates a summary of an exemplary detection and diagnosis methodology. In other example, the ITEE is not required, and other parameters may be used as monitoring variables.

TABLE 1

| Case | ITEE Mean | ITEE Variance | Correlation to Input | Comment |
|---|---|---|---|---|
| T/C | | | | |
| Offset | Y | — | — | |
| Noise | — | Y | — | |
| Dropouts | — | Y | — | Count of absolute error greater than 3-sigma |
| Heater element | Y | Y | Y | Error is correlated to heater power input; also change in heater zone resistance. |
| Power subsystem | Y | Y | Y | Error is correlated to heater power input |
| Insulation | Y | — | — | Most prominent during cooldown - heater power is zero. |

Process 600 then continues in 650. In 650, a query can be performed to determine if the mean and/or variance (VAR) of the estimation error is less than a threshold established for the process and/or system. In one embodiment, the model-based controller can calculate an inner T/C estimation error (ITEE) and, the ITEE mean and/or ITEE variance can be used. Alternatively, other estimation errors can be used. Thresholds can be established for different times during the monitoring procedure, and the query can be performed during different times during the monitoring procedure. Procedure 600 can branch to 655 and can continue as shown in FIG. 6 when the mean and/or variance of the estimation error are less than a threshold. Procedure 600 can branch to 660 and can continue as shown in FIG. 6 when the mean and/or variance of the estimation error are not less than a threshold.

In 655, when the mean and/or variance are less than a threshold, the monitoring procedure can establish that the system is operating within the operational limits.

In 660, when the mean and/or variance are not less than a threshold, the number of times the mean and/or variance of the estimation error is not less than a threshold can be counted. Process 600 then continues in 665.

In 665, a query can be performed to determine if the count is greater than a threshold established for the process and/or system. In one embodiment, the number of threshold deviations can include separate counts for the ITEE mean, for the ITEE variance, and for the sum. Alternatively, other estimation errors can be used. Thresholds can be established for different times during the monitoring procedure, and the query can be performed during different times during the monitoring procedure. Procedure 600 can branch to 670 and can continue as shown in FIG. 6 when the count is greater than a threshold. Procedure 600 can branch to 675 and can continue as shown in FIG. 6 when the count is not greater than a threshold.

In 670, when the count is greater than a threshold, a temperature sensor can be checked for a failure. For example, an inner and/or outer T/C may have degraded or failed.

In 675, when the count is not greater than a threshold, or after the temperature sensor has been checked, an error can be calculated that can be correlated to a temperature control system input, such as a heater power input and/or changes in a temperature control system parameter such as a heater zone resistance. Errors can be calculated in real-time. Alternatively, other system components may be examined, and/or other estimation errors may be used. Errors may be calculated at different times (e.g., t1) during the monitoring procedure, and the errors can be correlated to outputs. Process 600 then continues in 680.

In 680, a query can be performed to determine if the error is correlated to the heater power input that has been established for the process and/or system. Alternatively, other system components may be examined, and/or other estimation error may be used. Thresholds can be established for different times during the monitoring procedure, and the query can be performed during different times during the monitoring procedure.

In 685, when the error is correlated to the heater power input that has been established for the process and/or system, one or more heaters can be checked for a fault. Alternatively, other system components may be examined, and/or other estimation error may be used. Thresholds can be established for different times during the monitoring procedure, and the query can be performed during different times during the monitoring procedure.

In 690, when the error is not correlated to the heater power input that has been established for the process and/or system, or after the heaters are checked, one or more sensors, for example an inner T/C, can be checked for an offset. Alternatively, other system components may be examined. After 690, procedure 600 can branch to 615 and can continue as shown in FIG. 6, and the system can be examined using a non-model based procedure, as described above.

In some embodiments, a real-time estimator methodology can be used. Alternately, other methods may be used. The semiconductor processing system and/or one or more of the system components or subsystem components can be modeled using a set of nonlinear differential equations $\dot{x}$ and an output equation y as follows:

$$\dot{x} = f(x,p,u) + w$$

$$y = g(x,p,u) + v$$

where: x is the state vector which can consist of temperatures, pressures, and reactant states; the vector p consists of model parameters, such as heat capacity, thermal conductivity, and rate constants; the vector u consists of input applied to the process, such as heater powers; w is the additive white noise with zero mean, $E(w)=0$ ($E(\bullet)$ denotes the expectation operator), v is the additive white noise with zero mean, and $E(v)=0$.

Given the initial state $x_0$, input u, and parameters p, the differential equations can be integrated to compute the evolution of the state.

In addition, the models can be linearized for real-time applications. The linearization may lead to one or a set of models that describe the dynamics of the system along a nominal trajectory. These linear models are represented in state-space form by matrices $A_i$, $B_i$, and $C_i$ for each ith time interval. Thus, the nonlinear models are replaced by a sequence of discrete-time linear models:

$$x_{k+1} = A_i x_k + B_i u_k + w_k$$

$$y_k = C_i x_k + v_k$$

where k is a time index. The covariance of the initial state ($P_0$) is $E\{x_0 x_0^T\} = P_0$, where T is the transposition operator.

In various examples, single models can be used, and for these cases the i-subscript can be dropped and the system can be defined by:

$$x_{k+1}=Ax_k+Bu_k+w_k$$

$$y_k=Cx_k+v_k$$

A convenient method to build a real-time estimator is using Kalman filters matrices, $L_i$, which gives:

$$\hat{x}_{k+1}=A\hat{x}_k+Bu_k+L(y-C\hat{x})$$

$$\hat{y}_k=C\hat{x}_k$$

where ^ indicates an estimated value.

Using these equations, one can verify the "error dynamics" Z, which are the differences between the actual states and the estimated states and can be given as follows:

$$z_{k+1}=(A-LC)z_k+Lv_k-w_k$$

$$e_k=Cz_k+v_k$$

In one example, the vector $e_k$ may contain the inner T/C estimation error (ITEE).

From these equations, the following can be observed:
1) $z_k$ tends to zero from its initial value of $z_0$, since it is simply driven by zero mean noise.
2) The dynamics of $z_k$ are controlled by (A–LC), which was the purpose of the Kalman filter design.
3) The output estimation error $e_k$ also tends to zero.

When several error conditions are examined, the following can be assumed. For example, one can assume that the measurement "y" can include the inner and outer T/Cs for each zone, and that the input "u" can include the heater powers applied in each zone. Alternatively, other parameters can be used.

In some embodiments, the noise terms "w" and "v" can be dropped. Alternatively, the noise terms "w" and "v" may be used.

When there is an offset in an inner T/C, the offset can be denoted by a vector "f", and therefore, the plant model becomes:

$$x_{k+1}=Ax_k+Bu_k$$

$$y_k=Cx_k+f$$

For example, if the offset is in the first inner T/C, the vector "f" can be written as:

$$f_1 = \begin{pmatrix} 1 \\ 0 \\ \vdots \\ 0 \end{pmatrix}$$

Now, the error dynamics become:

$$z_{k+1}=(A-LC)z_k+Lf$$

$$e_k=Cz_k$$

From these updated error dynamics, we can conclude:
1) Rather than tending to zero, $z_k$ will achieve some non-zero steady-state value.
2) Likewise, $e_k$ will achieve some non-zero steady-state value.
3) However, $e_k$ will not be correlated to the input $u_k$.

In this example, suppose there is a fault condition in the heater power subsystem—in particular there is a multiplicative error in the way the power is applied. Let this multiplicative factor be denoted by a diagonal matrix. So, the plant model becomes:

$$x_{k+1}=Ax_k+\Gamma Bu_k$$

$$y_k=Cx_k$$

where, $$\Gamma = \begin{pmatrix} \gamma_1 & & & \\ & \gamma_2 & & \\ & & \ddots & \\ & & & \gamma_n \end{pmatrix}$$

In the above matrix, each element $\gamma_i$ is 1 unless there is a fault in that heater zone.

With these definitions, the error dynamics become:

$$z_{k+1}=(A-LC)z_k-(I-\Gamma)Bu_k$$

$$e_k=Cz_k$$

Again, from these equations, we can conclude:
4) Rather than tending to zero, $z_k$ will achieve some non-zero steady-state value
5) Likewise, $e_k$ will achieve some non-zero steady-state value.
6) $e_k$ will be correlated to the input $u_k$.

In addition, a steady-state check can be made. Consider again the dynamic model of the system (leaving out the noise terms for now). They are:

$$\dot{x}=f(x,p,u)$$

$$y=g(x,p,u)$$

At some steady state, $\dot{x}=0$, and the steady-state values for the state, input, and output will be $x_s$, $u_s$, and $y_s$ respectively. Using known steady state values of the input and output for a reference system (e.g., $u_{ref}$ and $y_{ref}$), the steady-state values for any given system can be monitored and compared to the reference. In particular, if the feedback controller drives the system output to $y_{ref}$, the value of $u_s$ can be checked; that is:

Drive the outputs to the reference value: $y_s \rightarrow y_{ref}$, and hence $$\|y_s - y_{ref}\| \leq \varepsilon$$

Check the inputs to the reference value: Is $\|u_s - u_{ref}\| \leq \varepsilon$?

If the difference is small, then the system under test (SUT) is operating like the reference system; otherwise, a possibility of an error condition is indicated.

As a first example, consider a thermal processing chamber with five zones; suppose on the thermal processing chamber it has been determined that when all the zones are at 600° C., the heater power should be as shown in Table 2.

TABLE 2

| Zone | Power (W) |
|------|-----------|
| 1 | 1200 |
| 2 | 1300 |
| 3 | 1400 |

TABLE 2-continued

| Zone | Power (W) |
|------|-----------|
| 4 | 1400 |
| 5 | 1300 |

When a thermal processing chamber at the same five 600° C. temperature zones is reporting a heater power of 2600 W in zone 5, it is clear that some sort of error condition is indicated—the error condition could be with the heater zone, o-rings, etc., and must be diagnosed with further tests.

In one embodiments, a dynamic response check can be performed. As described herein, one way to detect error is to monitor the dynamic response of the system and compare it to the reference. For example, a dynamic real-time estimator can be used for this purpose. Consider a linear estimator created with the reference system, where the estimates of the output are given by:

$$\hat{y}_k = C\hat{x}_k + v_k$$

When the SUT is producing outputs $y_k$, a check can be performed to determine if the two are close enough:

Check the SUT output with estimates of reference system    Is $\sum_{i=1}^{n} |y_k - \hat{y}_k|$ reasonably small?

A number if simulations were performed and a number of simulations results based of the theory presented in the previous section were generated. For the furnace, we are using model data previously obtained for a batch furnace having four zones.

For some simulations, a simple step and hold recipe has been used—the wafer temperature setpoint is initially at 700° C., then changed to 750° C., and finally back to 700° C.

Figure 7:
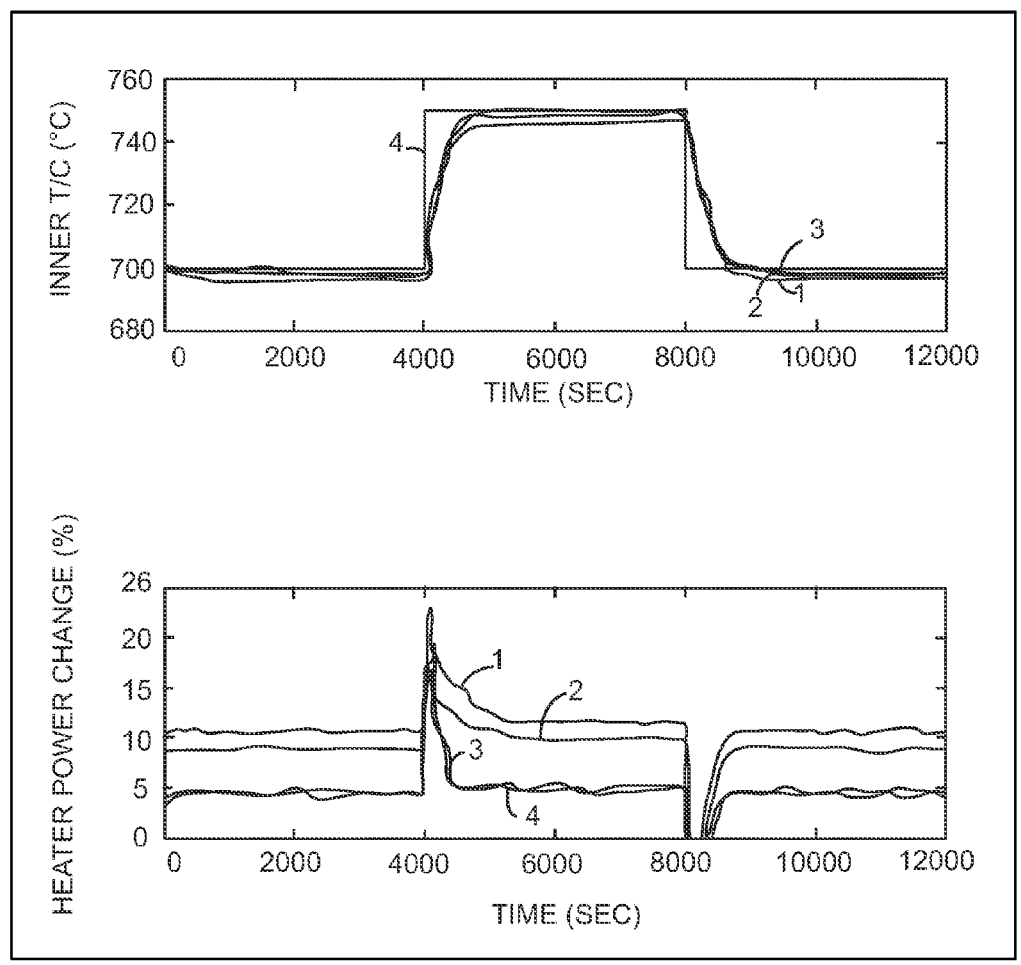
FIG. 7 illustrates a nominal response of a batch furnace showing inner T/C and heater powers for each of the four zones in accordance with embodiments of the invention.

FIG. 7 illustrates a nominal response of a batch furnace showing inner T/C and percent change in heater power for each of the four zones (1-4). In some cases, when the setpoint applies to the wafer temperatures, the inner T/C do not necessarily go to the setpoint.

Figure 8:
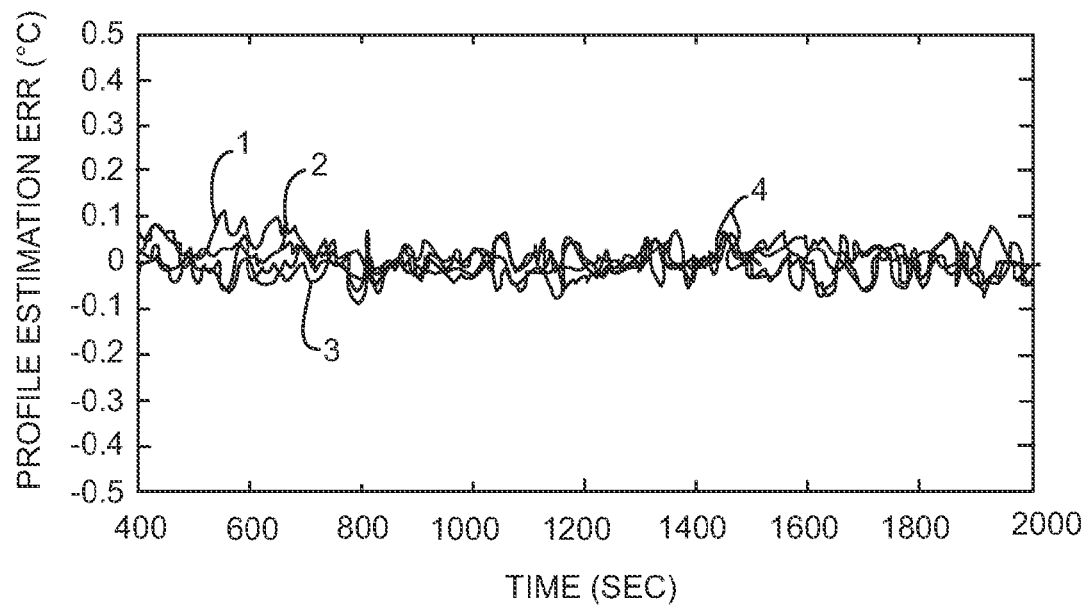
FIG. 8 illustrates the baseline profile estimation error for each zone in accordance with embodiments of the invention.

FIG. 8 illustrates the baseline profile estimation error for each zone (1-4). From this data, one can establish that the estimation error for each zone is zero-mean with a variance of approx 0.1° C. related to the process noise.

Other simulations were performed to examine the offset error in the inner T/C. In these simulations, a 1° C. offset error was introduced into the inner T/C, and one error was used for each simulation. In this case, the plant model becomes:

$$x_{k+1} = Ax_k + Bu_k$$

$$y_k = Cx_k + f_i$$

where $$f_1 = \begin{pmatrix} 1 \\ 0 \\ 0 \\ 0 \end{pmatrix}, f_2 = \begin{pmatrix} 0 \\ 1 \\ 0 \\ 0 \end{pmatrix}, f_3 = \begin{pmatrix} 0 \\ 0 \\ 1 \\ 0 \end{pmatrix}, \text{ and } f_4 = \begin{pmatrix} 0 \\ 0 \\ 0 \\ 1 \end{pmatrix}$$

Thus, four simulations were performed and each one used one of the above vectors. Again, recall that the profile estimation error $e_k$ is given by:

$$z_{k+1} = (A - LC)z_k + Lf$$

$$e_k = Cz_k$$

Figure 9:
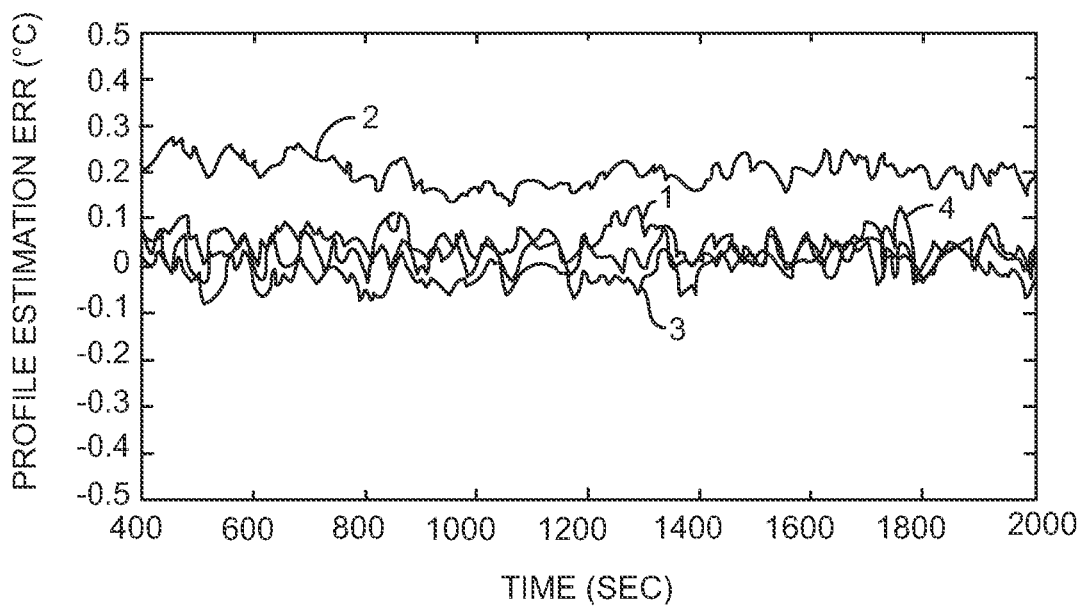
FIG. 9 illustrates the profile estimation error in each zone with an offset in an inner thermocouple (T/C) in accordance with an embodiment of the invention.

FIG. 9 illustrates the profile estimation error in each zone (1-4) with 1° C. offset in the second inner T/C (f2). In the simulation, process noise was introduced to better represent what may be observed in a real furnace process run—the noise are zero mean Gaussian variables.

From the plot, the following can be observed:

1) Profile Estimation Error for zone #2 has a clear non-zero mean value.

2) The other zones have a smaller non-zero mean value.

These simulations illustrate that the profile estimation error can be used in determining if there is an offset error in the profile T/C measurements.

Figure 10:
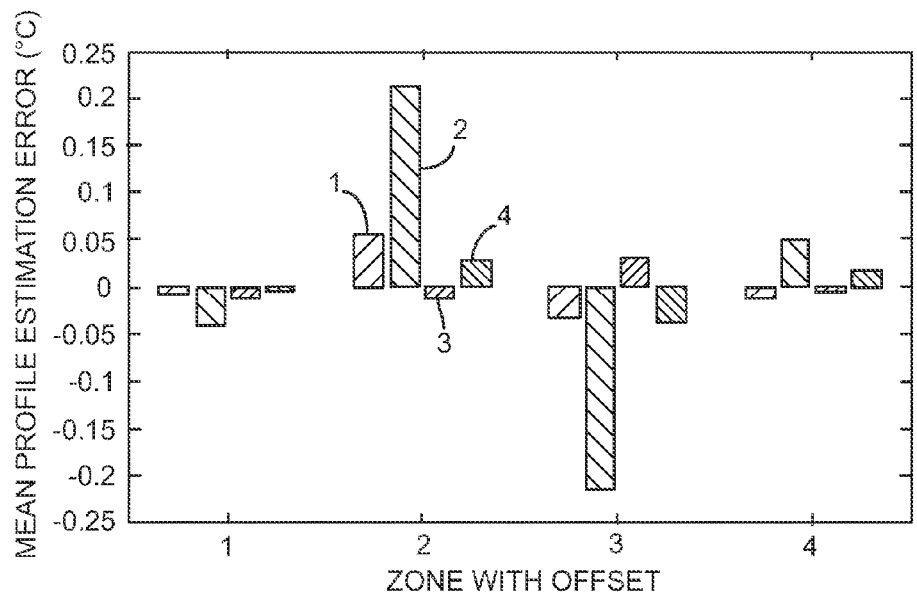
FIG. 10 illustrates a summary of profile estimation error for an offset in each zone in accordance with embodiments of the invention.

FIG. 10 illustrates a summary of profile estimation error for a 1° C. offset in each zone (1-4). The bar chart illustrates the change in mean value of the profile estimation error for each of the four simulations when only one offset is used at one time. From FIG. 10, the following can be concluded:

1) For zone #2 and #3 there is a clearer change in the profile estimation error compared to zone #1 and #4.

2) The pattern of the errors may be useful to determine which channel it is associated with.

In other simulations, a heater power error was examined. The profile estimation error can be examined when there is a multiplicative error in the heater power applied to the system. Recall that in this case the model is:

$$x_{k+1} = Ax_k + \Gamma Bu_k$$

$$y_k = Cx_k$$

where, $$\Gamma = \begin{pmatrix} \gamma_1 & & & \\ & \gamma_2 & & \\ & & \ddots & \\ & & & \gamma_n \end{pmatrix}$$

In the following simulation, a multiplicative factor of 0.85 for heater zone #2 has been used. In other words:

$$\gamma_1 = \gamma_3 = \gamma_4 = 1, \text{ and } \gamma_2 = 0.85$$

Recall, that the error equation showed that the estimation error will be correlated to the heater powers, since the error dynamics become:

$$z_{k+1} = (A - LC)z_k - (I - \Gamma)Bu_k$$

$$e_k = Cz_k$$

Figure 11:
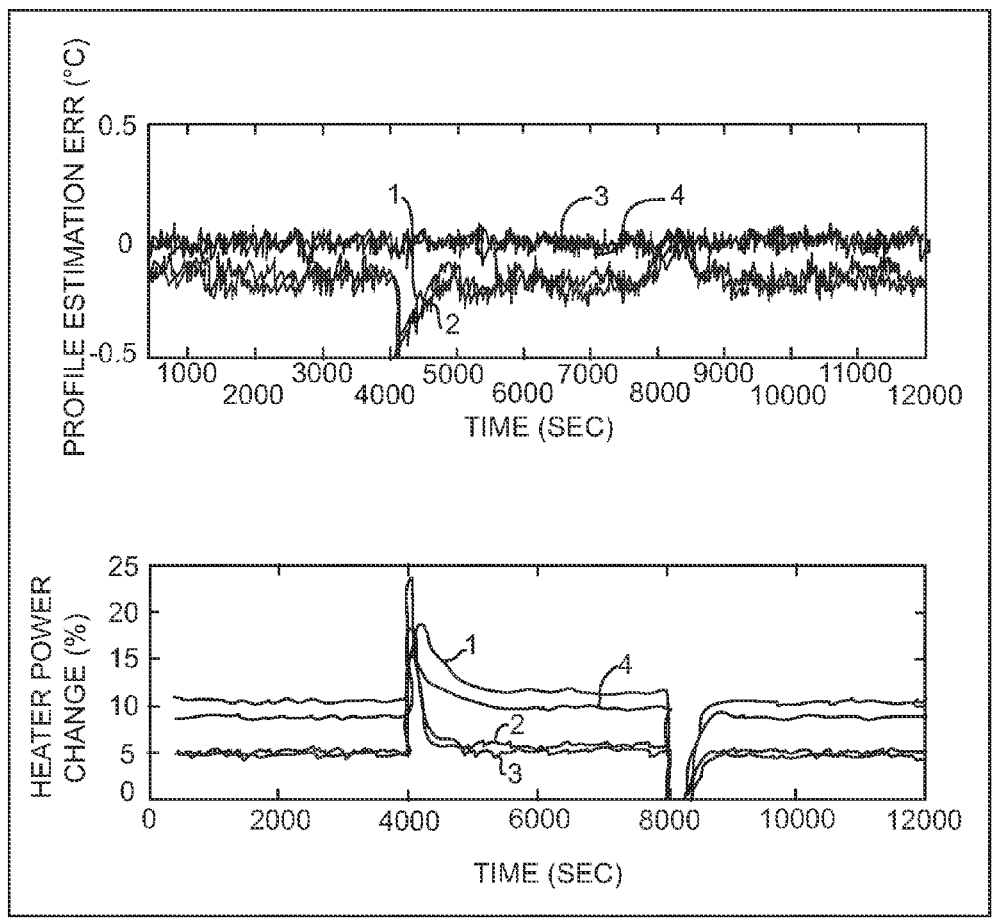
FIG. 11 illustrates a profile estimation error and heater powers with a multiplicative error in accordance with embodiments of the invention.

FIG. 11 illustrates a profile estimation error and percent change in heater power in each zone (1-4) with a multiplicative error of 0.85 in heater zone #2. The data in FIG. 11 shows that the estimation error is correlated to the heater powers. Note that estimation error for zones 1 and 2 are correlated with the heater powers—they increase when there is a greater change in heater powers, which occurs during the temperature ramp up and ramp down stages of the recipe.

To verify the methodologies of the invention, testing was performed using a four-zone system, but the system did not use a model-based controller. During testing, the focus was on the steady-state and transient response characteristics.

The experiments included ramp and hold recipes in which chamber temperatures were ramped up in one case from approximately 550° C. to approximately 600° C., in a second case from approximately 600° C. to approximately 700° C., and in a third case from approximately 700° C. to approximately 800° C.

In addition, the experiments included ramp and hold recipes in which chamber temperatures were ramped down in one case from approximately 800° C. to approximately 700° C., in a second case from approximately 700° C. to approximately 600° C., and in a third case from approximately 600° C. to approximately 550° C.

Furthermore, the experiments include zone-by-zone perturbation in which each zone profile temperature was changed +/−10° C. from a 600° C. setpoint. The experiments were performed to characterize the furnace response for various metrics described herein.

In various embodiments, the following metrics can be used to form the "baseline signature" of the thermal response of the system.

1) Time taken to reach 70%, 90%, and 99% of the setpoint for the ramp-up cases for each zone;
2) Ramp down slope for each zone;
3) Steady-state outer T/C temperature for each case of 600° C., 700° C., and 800° C.; and
4) Steady-state power for each of 600° C., 700° C., and 800° C.

Figure 12:
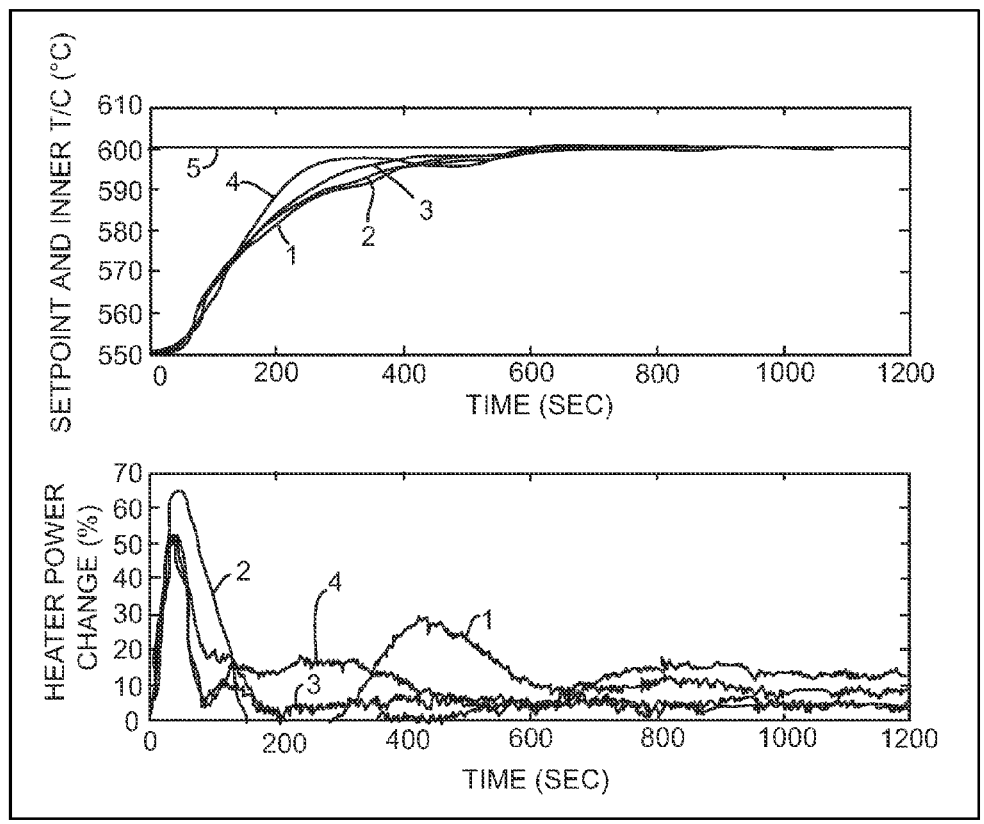
FIG. 12 illustrates a ramp up to 600° C. with cascade control in accordance with embodiments of the invention.

FIG. 12 illustrates a ramp up to 600° C. with cascade control. The data in the upper part of FIG. 12 shows the setpoint (5) and the inner T/C data in each zone (1-4), and the lower part of FIG. 12 shows the percent change in heater power in each zone (1-4).

Figure 13:
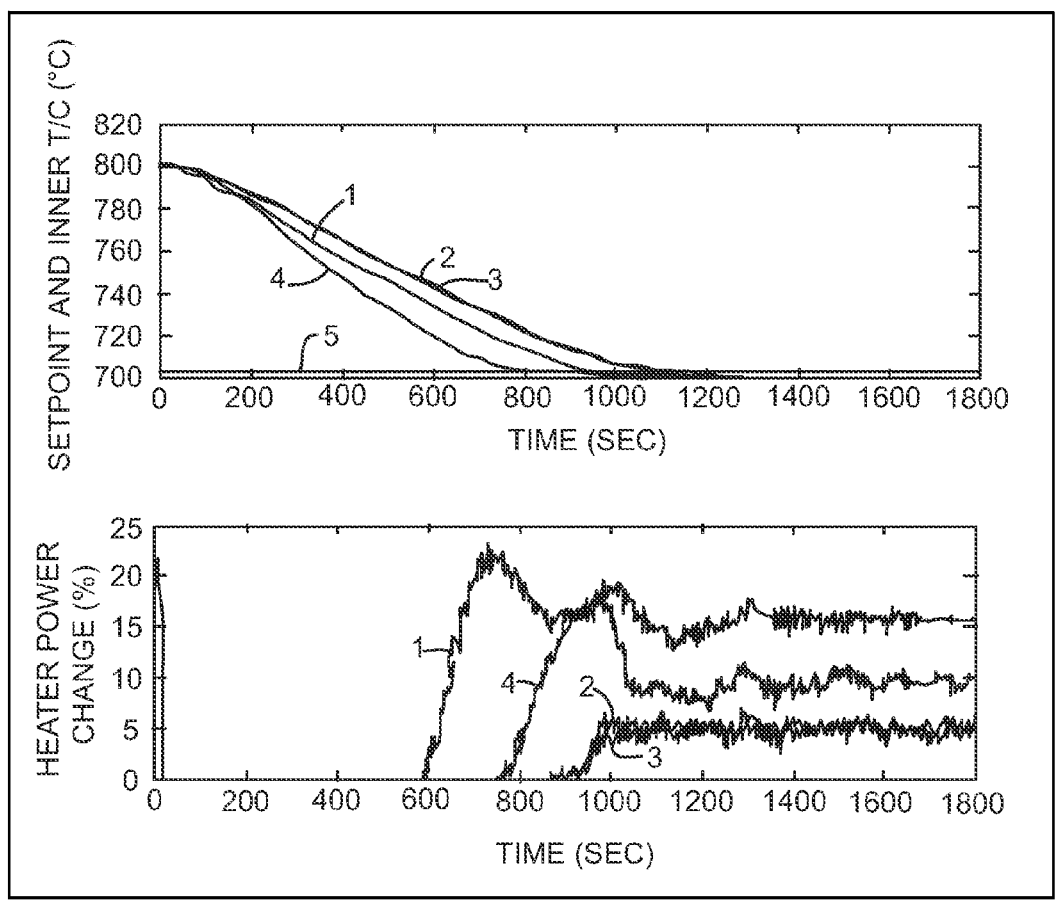
FIG. 13 illustrates a ramp-down from 800° C. to 700° C. with cascade control in accordance with embodiments of the invention.

FIG. 13 illustrates a ramp-down from 800° C. to 700° C. with cascade control. The data in the upper part of FIG. 13 shows the setpoint (5) and the inner T/C data in each zone (1-4), and the lower part of FIG. 13 shows the percent change in heater power in each zone (1-4).

Figure 14:
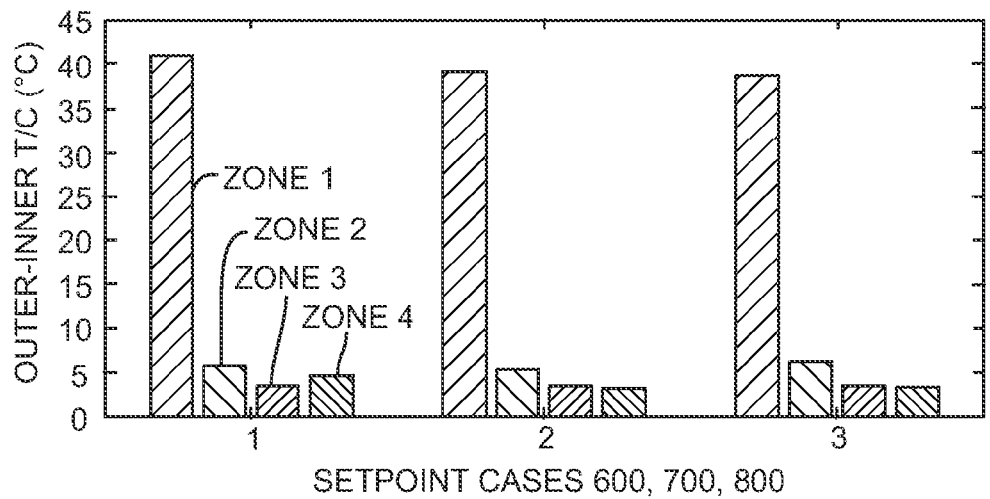
FIG. 14 illustrates the relationship between the inner and the outer temperature sensor in each zone in accordance with embodiments of the invention.

When developing baseline model parameters, the relationship between the inner and outer T/C can be examined. FIG. 14 illustrates the relationship between the inner and the outer temperature sensor in each zone (1-4). Specifically, FIG. 14 shows the difference between the outer and inner T/C in each of the four zones when the furnace is at 600° C., 700° C., and 800° C. when cascade control is being used. These charts show the "baseline" differences When baseline differences are established, deviation from the baseline can be used to indicate degraded operating conditions.

Figure 15:
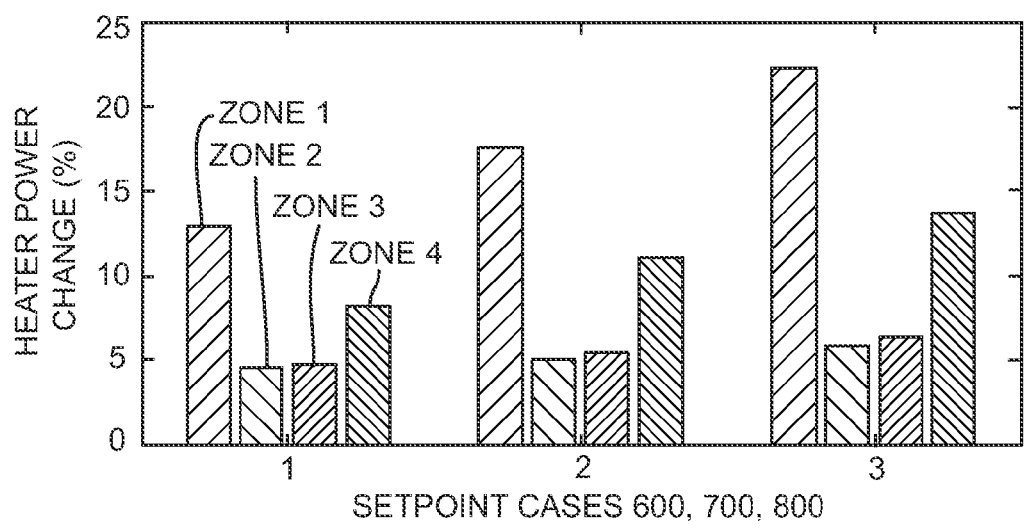
FIG. 15 illustrates the heater power in each of the four zones in accordance with embodiments of the invention.

When developing baseline model parameters, the heater power can also be examined. FIG. 15 illustrates the heater power in each of the four zones (1-4) when the furnace is at 600° C., 700° C., and 800° C., and cascade control is being used. The data in FIG. 15 shows that the heater power is a strong function of the furnace temperature—especially evident are zones 1 and 4. These charts show the "baseline" differences. When baseline differences are established, deviation from the baseline can be used to indicate degraded operating conditions.

Figure 16:
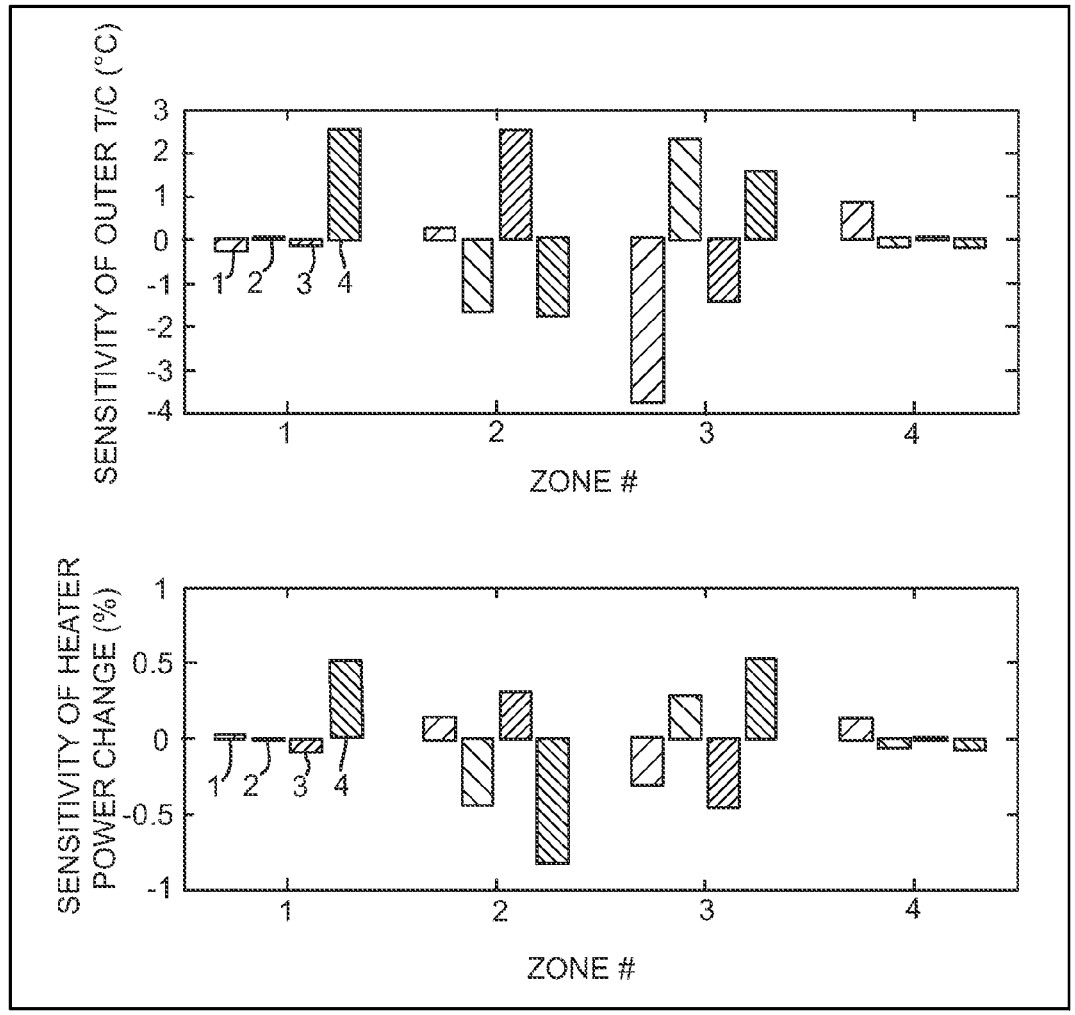
FIG. 16 illustrates the sensitivity values in each of the four zones when cascade control is being used in accordance with embodiments of the invention.

In addition, when developing baseline model parameters, the zone-by-zone sensitivity can be examined. The sensitivity data can be based on the thermal response of the furnace to zone-by-zone changes in a setpoint. When the furnace is under cascade control, the changes in setpoint are for the inner thermocouples. FIG. 16 illustrates the sensitivity values in each of the four zones (1-4) when cascade control is being used.

Based on the perturbations, two sensitivity matrices can be established:

M1=Outer T/C->Inner T/C

M2=Heater Power->Inner T/C

The matrices shown below are based on actual real-time data log collected on a furnace.

$$spdel = \begin{matrix} 0 & 0 & -4 & 1 \\ 0 & -2 & 2 & 0 \\ 0 & 3 & -1 & 0 \\ 3 & -2 & 2 & 0 \end{matrix}$$

In addition, the "sign" pattern of this matrix is quite instructive as well, and the sign pattern matrix is shown here:

$$spdel\_sign = \begin{matrix} 0 & 0 & -1 & 1 \\ 0 & -1 & 1 & 0 \\ 0 & 1 & -1 & 0 \\ 1 & -1 & 1 & 0 \end{matrix}$$

Therefore, the sign pattern can be used to establish where the deviation occurred in the inner T/C. Likewise, the heater power sensitivity matrix is:

$$hsp = \begin{matrix} 0 & 1 & -3 & 1 \\ 0 & -4 & 3 & -1 \\ -1 & 3 & -5 & 0 \\ 5 & -8 & 5 & -1 \end{matrix}$$

And again, the sign pattern can be used to establish where the deviation occurred in the heater.

Figure 17:
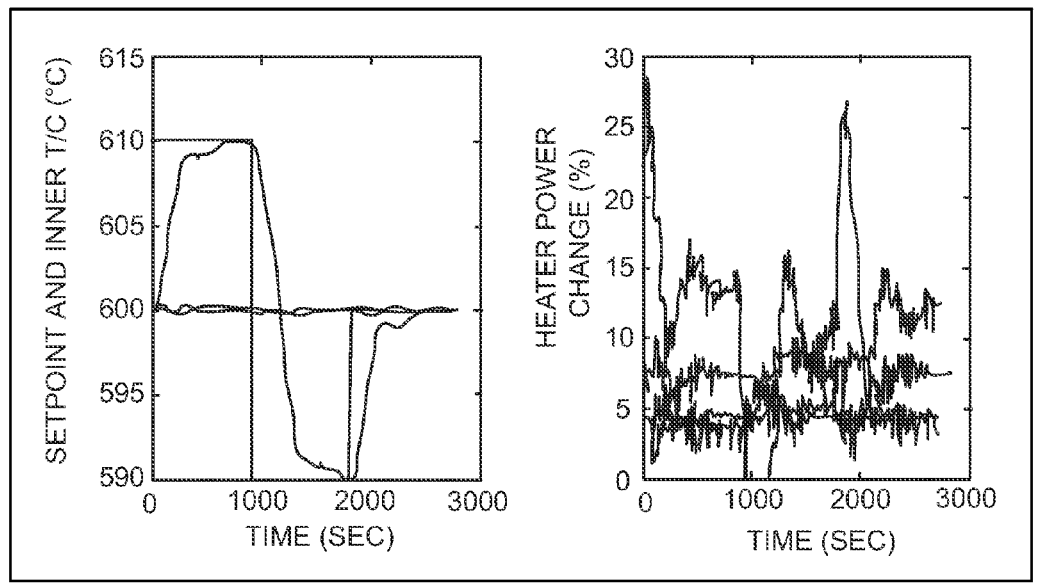
FIG. 17 illustrates a furnace response to a change in a temperature setpoint when the furnace is under cascade control in accordance with embodiments of the invention.

FIG. 17 shows one example of the perturbation in zone 1. Specifically, FIG. 17 illustrates a furnace response to a change of +/−10° C. in the temperature setpoint when the furnace is under cascade control. The data in the left plot shows the setpoint and inner T/C versus time, and the right plot shows heater power for the four zones (1-4) versus time.

In a model-based control system, a BIST methodology can be based on a number of different parameter matrices. In one embodiment, an Inner-Outer T/C Difference (IOTD) matrix, a Power Level Difference (PLD) matrix, and an Inner T/C Estimation Error sensitivity (ITEES) matrix can be used. Alternatively, other matrices may be used.

Additional data has been obtained using a five zone system that uses a model-based controller. During a first set of experiments, standard systems conditions were used to create baseline data. During a second set of experiments, 5 sets of data were collected: in run #1, a 5° C. offset was added to Inner T/C #1; in run #2, a 5° C. offset was added to Inner T/C #2, and so on. During a third set of experiments, an additional 5 sets of data were collected: in run #1, the zone 1 heater power was scaled to 90%; in run #2, the zone 2 heater power was scaled to 90%, and so on.

The BIST system can evaluate and track the parameters in these matrices in real time and can compare these measured parameters to the baseline data in real time. The BIST system can use any variations in these parameters to "detect" degradation in the thermal processing system. The BIST system can use a decision tree to then detect what is the cause of the variation or "diagnose" the problem.

Figure 18:
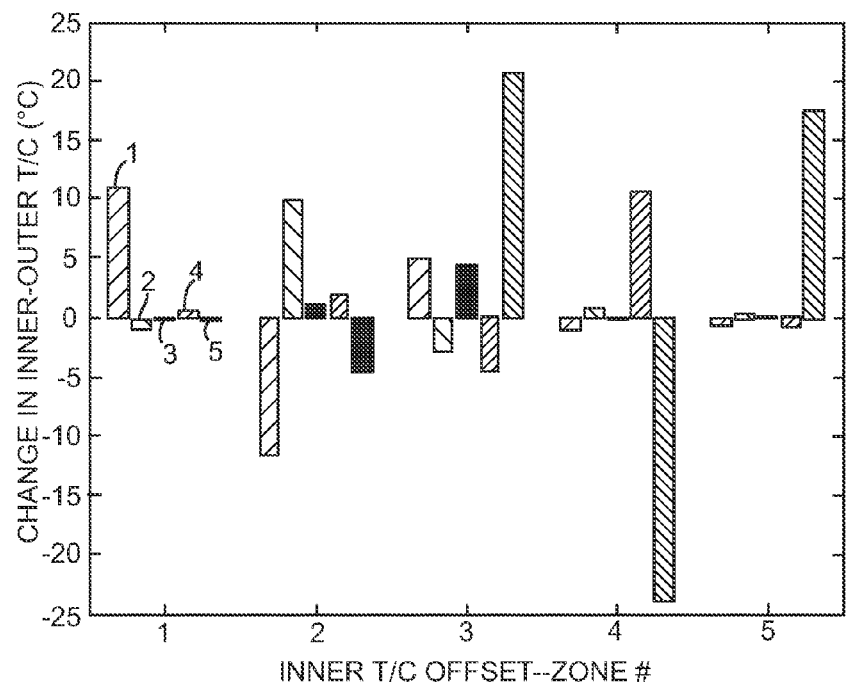
FIG. 18 shows the change in Inner-Outer T/C versus the T/C offset for a five zone system in accordance with embodiments of the invention.

FIG. 18 illustrates a bar chart that shows the change in the Inner-Outer T/C difference due to an offset in the Inner T/C. In each of the five runs, there is a positive change in Inner- Outer T/C in the corresponding zone. The pattern of change depends on which zone has an offset. For example, in zone 1 an offset of 5° C. in Inner T/C #1 causes a change that is greater than 10° C. in the Inner-Outer T/C #1. The Inner T/C offset data shown in FIG. 18 can be used to determine an Inner-Outer T/C Difference (IOTD) Matrix.

Figure 19:
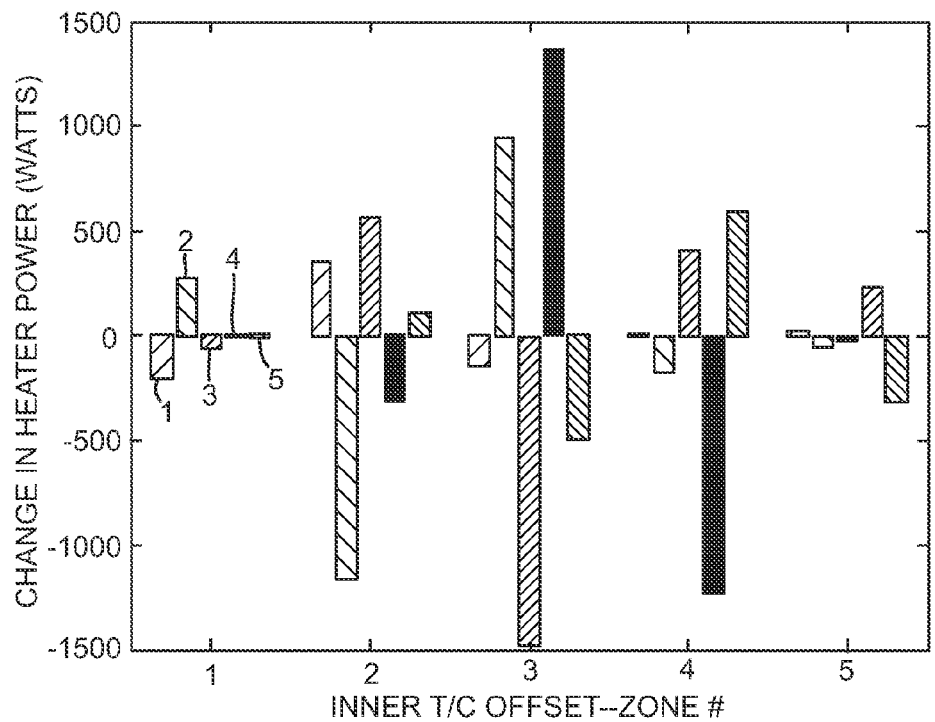
FIG. 19 illustrates a bar chart that shows the change in Heater Power (watts) due to an offset in the Inner T/C in accordance with embodiments of the invention.

FIG. 19 illustrates a bar chart that shows the change in Heater Power (watts) due to an offset in the Inner T/C. In each of the five runs, there is a decrease in the heater power of the corresponding zone where there is Inner T/C offset. For example, an offset of 5° C. in Inner T/C #1 causes a decrease of approximately 200 watts in heater power in zone #1. The heater power data shown in FIG. 19 can be used to determine a Power Level Difference (PDL) Matrix.

Figure 20:
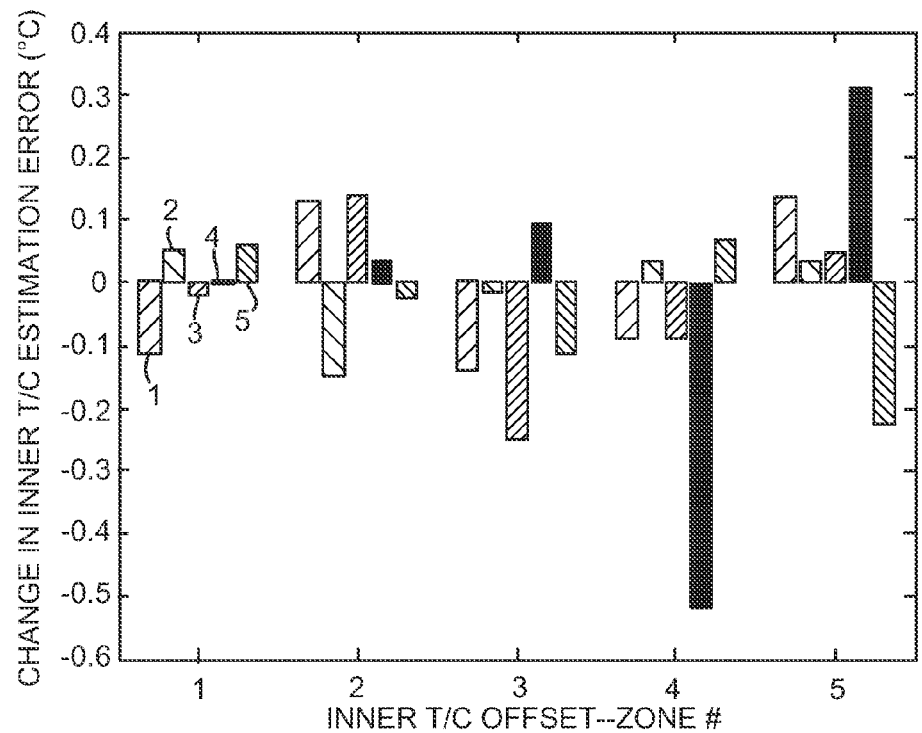
FIG. 20 illustrates a bar chart that shows the change in Inner T/C Estimation Error (ITEE) due to an offset in the Inner T/C in accordance with embodiments of the invention.

FIG. 20 illustrates a bar chart that shows the change in Inner T/C Estimation Error (ITEE) due to an offset in the Inner T/C. In each of the five runs, there is a negative change in the ITEE of the corresponding zone where there is Inner T/C offset. For example, an offset of 5° C. in the Inner T/C #4 causes a change of –0.5° C. in the ITEE in zone #4. The Inner T/C Offset data shown in FIG. 20 can be used to determine an Inner T/C Estimation Error Sensitivity (ITEES) Matrix.

Figure 21:
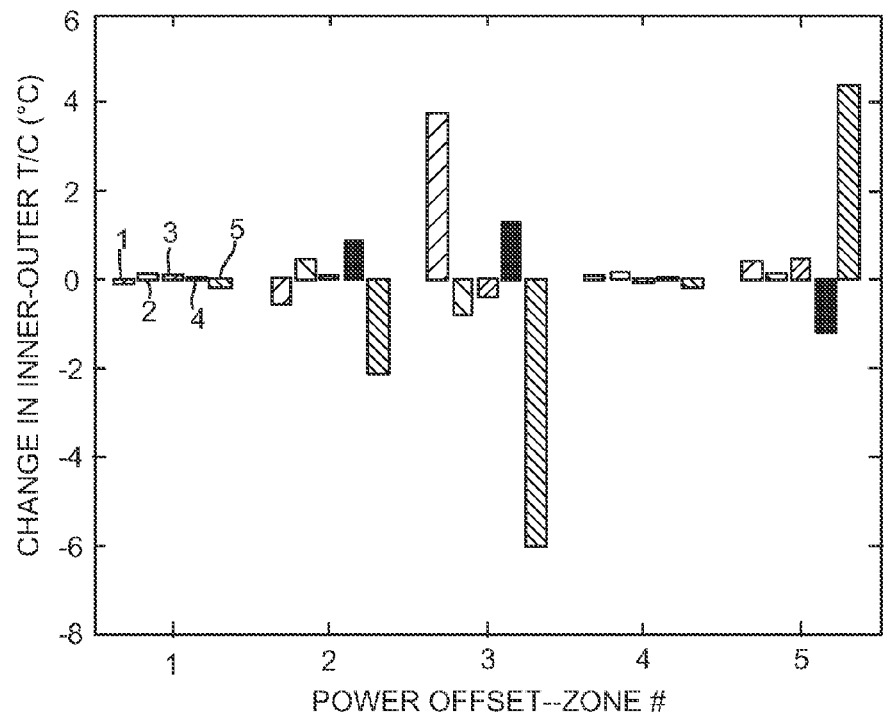
FIG. 21 illustrates a bar chart that shows the change in the Inner-Outer T/C difference due to a scaling of the heater power in accordance with embodiments of the invention.

FIG. 21 illustrates a bar chart that shows the change in the Inner-Outer T/C difference due to a scaling of the heater power. Changes in Inner-Outer T/C are small—except for the zone #4 and zone #5 combination, and therefore, one can expect that the change in the power scaling does not affect the Inner-Outer T/C change. The Inner T/C offset data shown in FIG. 21 can be used to determine one or more IOTD matrices.

Figure 22:
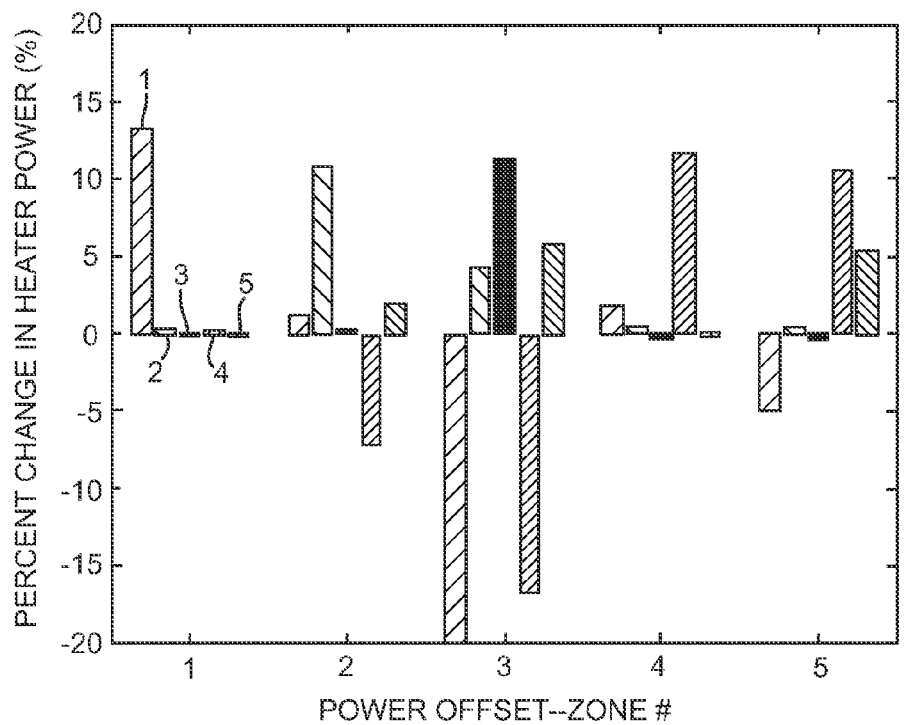
FIG. 22 illustrates a bar chart that shows the change in the heater power (%) due to a scaling of the heater power in accordance with embodiments of the invention.

FIG. 22 illustrates a bar chart that shows the percent change in the heater power due to a scaling of the heater power. In each of the five runs, there is an increase in heater power of the corresponding zone. The percent change in power is consistent with the power scaling. For example, when the zone 2 power is scaled, then the zone 2 power changes by ~10%. The heater power data shown in FIG. 22 can be used to determine one or more PDL matrices.

Figure 23:
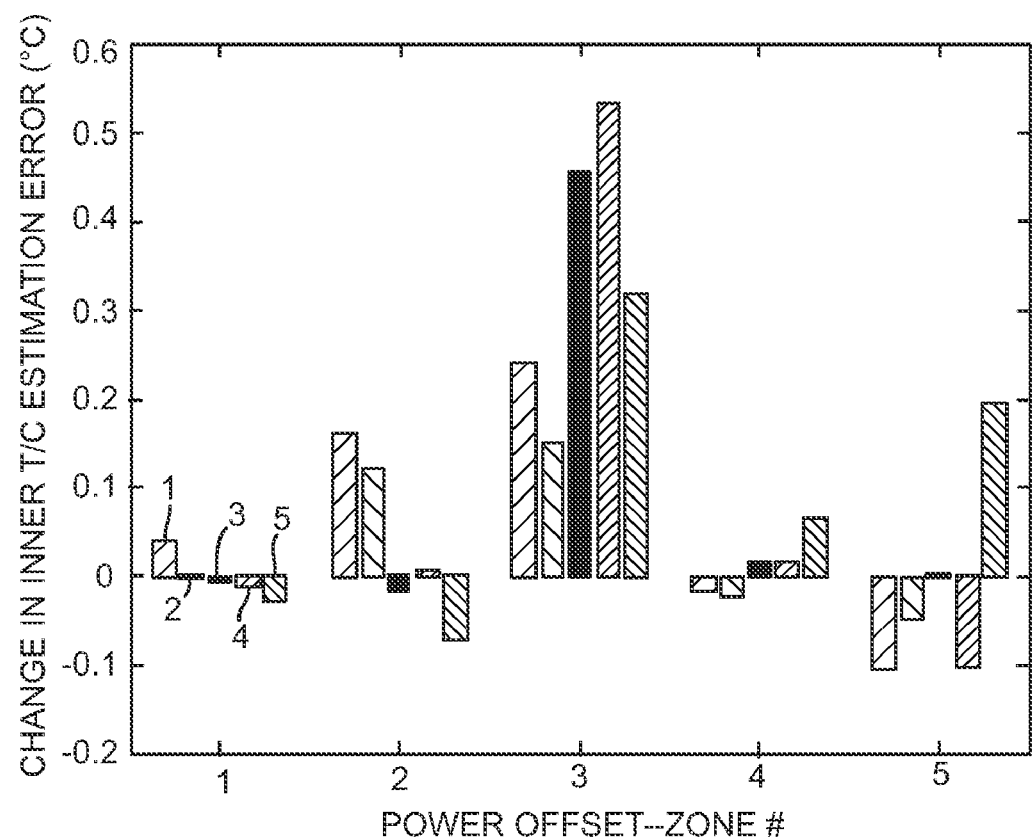
FIG. 23 illustrates a bar chart that shows the change in the Inner T/C Estimation Error (ITEE) due to a scaling of the heater power in accordance with embodiments of the invention.

FIG. 23 illustrates a bar chart that shows the change in the Inner T/C Estimation Error (ITEE) due to a scaling of the heater power. The amount of power change (10%) is the largest for heater zone #3. So, correspondingly, ITEE changes strongly for power scaling in zone #3. The change in ITEE with other zone power scaling is relatively small. The ITEE data shown in FIG. 22 can be used to determine one or more ITEES matrices.

Typically, bare silicon wafers are relatively flat and are manufactured within tight specifications. However, multiple films are deposited on wafers during multiple thermal processes, and as a result, wafers can acquire significant curvature. Wafer curvature can have an adverse impact on film uniformity and/or CD uniformity by creating problems during processing, including a deposition process.

A BIST system can be used to detect wafer errors and reject a wafer when it has excess curvature. Real-time data from one or more measurement devices can be used in a "mathematical model" to estimate and/or compensate for wafer curvature, and the model can be static or dynamic, linear or nonlinear.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and methods, and illustrative examples shown and described. Accordingly, departures may be made from such details without departing from the scope of applicants' general inventive concept.

What is claimed is:

1. A method of monitoring a thermal processing system using a Built-In Self Test (BIST) table, the method comprising:
positioning a plurality of wafers in a thermal processing chamber, wherein the thermal processing chamber is divided into different zones and one or more of the wafers are positioned in each zone;
performing a first self test process using a first set of process parameters, wherein the first set of process parameters is established by a first BIST rule created for the thermal processing system and stored in the BIST table;
determining in real-time a transient error using a difference between a measured transient response and a baseline transient response determined by the first BIST rule for the first self test process;
comparing the transient error to operational limits established by the first BIST rule for the first self test process;
continuing the first self test process when the transient error is within the operational limits; and
comparing the transient error to warning limits established by the first BIST rule for the first self test process when the transient error is not within at least one of the operational limits, and either
sending a warning message identifying a first transient error problem and continuing the first self test process when the transient error is within the warning limits, or
sending a fault message identifying a second transient error problem when the transient error is not within at least one of the warning limits.

2. The method of claim 1, wherein the measured transient response comprises a temperature sensor offset matrix and the baseline transient response comprises a first set of baseline temperature sensor offset matrices, wherein each of the first set of baseline temperature sensor offset matrices comprises a different time stamp.

3. The method of claim 2, wherein the measured transient response comprises an inner thermocouple offset matrix and the baseline transient response comprises a first set of baseline inner thermocouple offset matrices, wherein each of the first set of baseline inner thermocouple offset matrices comprises a different measurement time period.

4. The method of claim 1, wherein the measured transient response comprises a power system matrix and the baseline transient response comprises a first set of baseline power system matrices, wherein each of the first set of baseline power system matrices comprises a different time stamp.

5. The method of claim 4, wherein the measured transient response comprises a power level difference matrix and the baseline transient response comprises a first set of baseline power level difference matrices, wherein each of the first set of baseline power level difference matrices comprises a different measurement time period.

6. The method of claim 1, wherein the measured transient response comprises a sensitivity matrix and the baseline transient response comprises a first set of baseline sensitivity matrices, wherein each of the first set of baseline sensitivity matrices comprises a different time stamp.

7. The method of claim 6, wherein the measured transient response comprises a thermal sensor estimation error sensitivity matrix and the baseline transient response comprises a first set of baseline thermal sensor estimation error sensitivity matrices, wherein each of the first set of baseline thermal sensor estimation error sensitivity matrices comprises a different measurement time period.

8. The method of claim 7, wherein the thermal sensor estimation error sensitivity matrix comprises an inner thermocouple estimation error sensitivity (ITEES) matrix.

9. The method of claim 1, further comprising:
determining a steady-state error using a difference between a measured steady-state response and a baseline steady-state response determined by the first BIST rule for the first self test process;
comparing the steady-state error to the operational limits;
continuing the first self test process when the steady-state error is within the operational limits; and
comparing the steady-state error to the warning limits when the steady-state error is not within at least one of the operational limits, and either
sending a warning message identifying a first steady-state error problem and continuing the first self test process when the steady-state error is within the warning limits, or
sending a fault message identifying a second steady-state error problem when the steady-state error is not within at least one of the warning limits.

10. The method of claim 9, wherein the measured steady-state response comprises a temperature sensor offset matrix and the baseline steady-state response comprises a first set of baseline temperature sensor offset matrices, wherein each of the first set of baseline temperature sensor offset matrices comprises a different time stamp.

11. The method of claim 10, wherein the measured steady-state response comprises an inner thermocouple offset matrix and the baseline steady-state response comprises a first set of baseline inner thermocouple offset matrices, wherein each of the first set of baseline inner thermocouple offset matrices comprises a different measurement time period.

12. The method of claim 9, wherein the measured steady-state response comprises a power system matrix and the baseline steady-state response comprises a first set of baseline power system matrices, wherein each of the first set of baseline power system matrices comprises a different time stamp.

13. The method of claim 12, wherein the measured steady-state response comprises a power level difference matrix and the baseline steady-state response comprises a first set of baseline power level difference matrices, wherein each of the first set of baseline power level difference matrices comprises a different measurement time period.

14. The method of claim 9, wherein the measured steady-state response comprises a sensitivity matrix and the baseline steady-state response comprises a first set of baseline sensitivity matrices, wherein each of the first set of baseline sensitivity matrices comprises a different time stamp.

15. The method of claim 14, wherein the measured steady-state response comprises a thermal sensor estimation error sensitivity matrix and the baseline steady-state response comprises a first set of baseline thermal sensor estimation error sensitivity matrices, wherein each of the first set of baseline thermal sensor estimation error sensitivity matrices comprises a different measurement time period.

16. The method of claim 15, wherein the thermal sensor estimation error sensitivity matrix comprises an inner thermocouple estimation error sensitivity (ITEES) matrix.

17. The method of claim 9, further comprising:
calculating a mean value for the steady-state error;
calculating a variance value for the steady-state error;
calculating a correlation value for the steady-state error; and
determining the first steady-state error problem and/or the second steady-state error problem using the mean value for the steady-state error, the variance value for the steady-state error, or the correlation value for the steady-state error, or a combination thereof.

18. The method of claim 9, further comprising:
calculating a 3-sigma value for the steady-state error; and
identifying and counting a steady-state dropout when the steady-state error exceeds the 3-sigma value for the steady-state error.

19. The method of claim 9, further comprising:
identifying the thermal processing system as an operational system when the transient error and the steady-state error are within the operational limits; and
identifying the thermal processing system as a non-operational system when the transient error and/or the steady-state error is not within the operational limits.

20. The method of claim 9, further comprising:
calculating a sensitivity matrix for a temperature measuring element in the thermal processing system, wherein a setpoint is changed from a first value to a second value;
determining a sign matrix from the sensitivity matrix; and
determining the first transient error problem and/or the second transient error problem using the sensitivity matrix, or the sign matrix, or a combination thereof.

21. The method of claim 1, further comprising:
calculating a mean value for the transient error;
calculating a variance value for the transient error;
calculating a correlation value for the transient error; and
determining the first transient error problem and/or the second transient error problem using the mean value for the transient error, the variance value for the transient error, or the correlation value for the transient error, or a combination thereof.

22. The method of claim 1, further comprising:
calculating a 3-sigma value for the transient error; and
identifying and counting a transient dropout when the transient error exceeds the 3-sigma value for the transient error.

23. The method of claim 1, further comprising:
calculating a sensitivity matrix for a temperature controlling element in the thermal processing system, wherein a setpoint is changed from a first value to a second value;
determining a sign matrix from the sensitivity matrix; and
determining the first transient error problem and/or the second transient error problem using the sensitivity matrix, or the sign matrix, or a combination thereof.

24. The method of claim 1, further comprising:
monitoring the first self test process using a first set of nonlinear differential equations $\dot{x}_1$ and a first output equation $y_1$, wherein $$\dot{x}_1 = f(x_1, p_1, u_1)$$

$$y_1 = g(x_1, p_1, u_1)$$

and the first vector $x_1$ comprises a first state vector for the first self test process, the first vector $p_1$ comprises one or more modeling parameters for the first self test process, and the vector $u_1$ comprises one or more inputs applied during the first self test process.

25. The method of claim 1, wherein the baseline transient response includes data for a plurality of time values based on percent values of a setpoint.

* * * * *